(12) United States Patent
Olson et al.

(10) Patent No.: US 12,381,154 B2
(45) Date of Patent: Aug. 5, 2025

(54) FULLY MOLDED BRIDGE INTERPOSER AND METHOD OF MAKING THE SAME

(71) Applicant: Deca Technologies USA, Inc., Tempe, AZ (US)

(72) Inventors: Timothy L. Olson, Phoenix, AZ (US); Craig Bishop, Scottsdale, AZ (US); Clifford Sandstrom, Richfield, MN (US)

(73) Assignee: Deca Technologies USA, Inc., Tempe, AZ (US)

( * ) Notice: Subject to any disclaimer, the term of this patent is extended or adjusted under 35 U.S.C. 154(b) by 0 days.

(21) Appl. No.: 18/085,397

(22) Filed: Dec. 20, 2022

(65) Prior Publication Data

US 2023/0142384 A1 May 11, 2023

Related U.S. Application Data

(63) Continuation of application No. 17/581,704, filed on Jan. 21, 2022, now Pat. No. 11,538,759.
(Continued)

(51) Int. Cl.
*H01L 23/538* (2006.01)
*H01L 21/48* (2006.01)
(Continued)

(52) U.S. Cl.
CPC ...... *H01L 23/5381* (2013.01); *H01L 21/4857* (2013.01); *H01L 21/486* (2013.01); *H01L 23/49816* (2013.01); *H01L 23/49822* (2013.01); *H01L 23/49833* (2013.01); *H01L 23/49838* (2013.01); *H01L 23/5385* (2013.01); *H01L 23/5386* (2013.01); *H01L 24/13* (2013.01); *H01L 24/16* (2013.01); *H01L 25/105* (2013.01); *H01L 23/5389* (2013.01);
(Continued)

(58) Field of Classification Search
CPC .................................................. H01L 23/5381
See application file for complete search history.

(56) References Cited

U.S. PATENT DOCUMENTS 9,831,170 B2 * 11/2017 Scanlan ................. H01L 24/97
10,510,721 B2 * 12/2019 Bhagavat ............ H01L 23/5384
(Continued)

FOREIGN PATENT DOCUMENTS

KR    1020160123959    10/2016
WO       2020263952    12/2020

*Primary Examiner* — William A Harriston
(74) *Attorney, Agent, or Firm* — Kenneth C. Booth; Booth Udall Fuller, PLC

(57) ABSTRACT

A semiconductor device may comprise a bridge die comprising copper studs. Copper posts may be disposed in a periphery of the bridge die. An encapsulant may be disposed on five sides of the bridge die, on sides of the copper studs, and on sides of the copper posts that leave ends of the copper studs and opposing first and second ends of the copper posts exposed from the encapsulant. A frontside build-up interconnect structure may be formed over the copper studs of the bridge die and coupled to second ends of the copper posts opposite the first ends of the copper posts. The frontside build-up interconnect structure comprising first pads at a first pitch within a footprint of the bridge die and second pads at a second pitch outside a footprint of the bridge die. The first pitch may be at least 1.5 times less than the second pitch.

20 Claims, 13 Drawing Sheets

Related U.S. Application Data

(60) Provisional application No. 63/141,945, filed on Jan. 26, 2021.

(51) Int. Cl.
*H01L 23/00* (2006.01)
*H01L 23/498* (2006.01)
*H01L 25/10* (2006.01)

(52) U.S. Cl.
CPC .............. *H01L 2224/13147* (2013.01); *H01L 2224/16235* (2013.01); *H01L 2225/1035* (2013.01); *H01L 2225/1058* (2013.01)

(56) References Cited

U.S. PATENT DOCUMENTS

| | | | |
|---|---|---|---|
| 10,593,620 B2 * | 3/2020 | Agarwal | H01L 21/565 |
| 11,056,453 B2 * | 7/2021 | Olson | H01L 24/11 |
| 2012/0038061 A1 | 2/2012 | Su | |
| 2017/0148755 A1 | 5/2017 | Scanlan | |
| 2018/0130761 A1 * | 5/2018 | Kim | H01L 24/05 |
| 2019/0221520 A1 | 7/2019 | Kim | |
| 2019/0326257 A1 | 10/2019 | Agarwal | |
| 2020/0043853 A1 * | 2/2020 | Kim | H01L 24/81 |
| 2020/0294923 A1 * | 9/2020 | Bhagavat | H01L 24/24 |
| 2020/0328161 A1 * | 10/2020 | Lin | H01Q 1/2283 |
| 2020/0409859 A1 | 12/2020 | Saleh | |
| 2020/0411443 A1 * | 12/2020 | Guo | H01L 24/09 |

\* cited by examiner

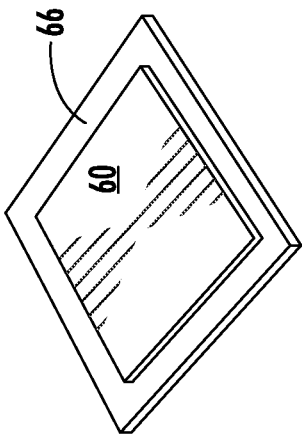
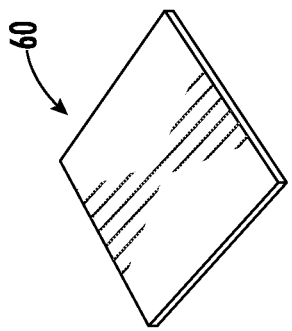
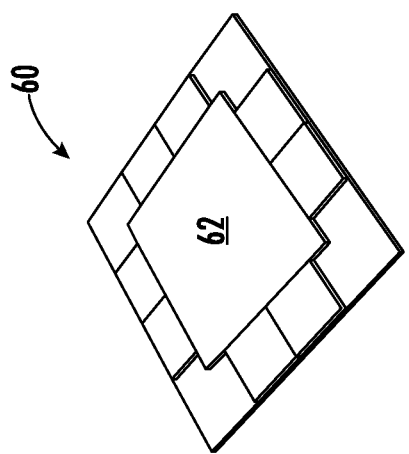

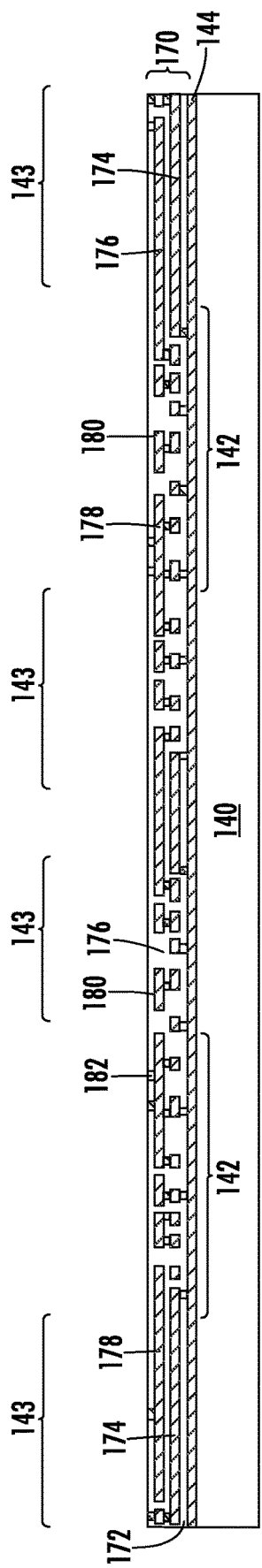
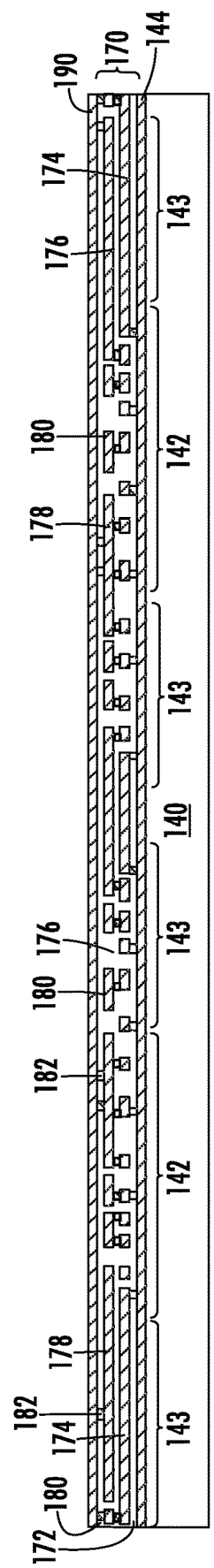
FIG. 4A
FIG. 4B

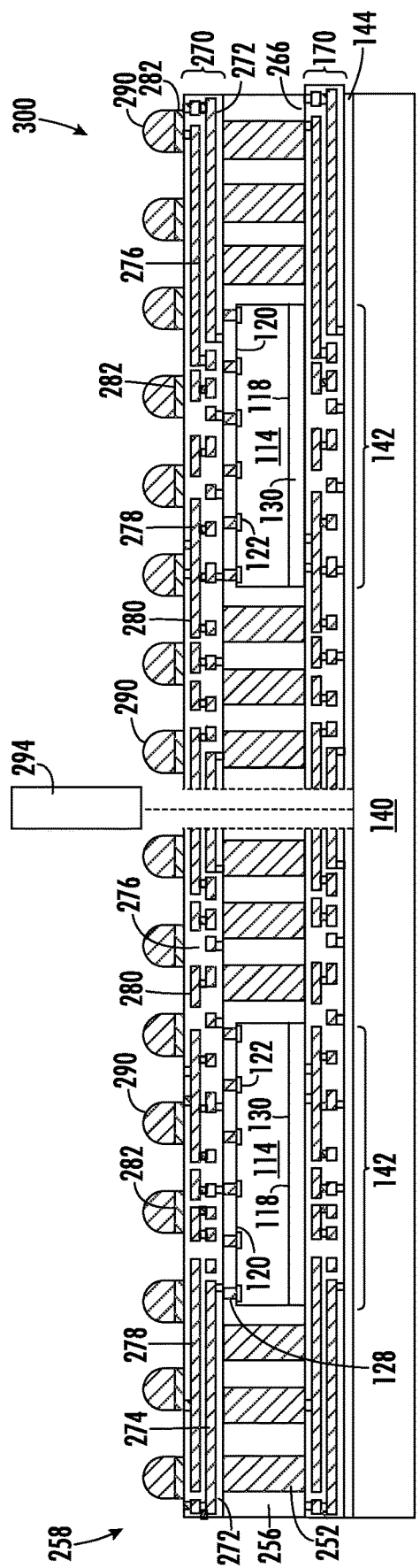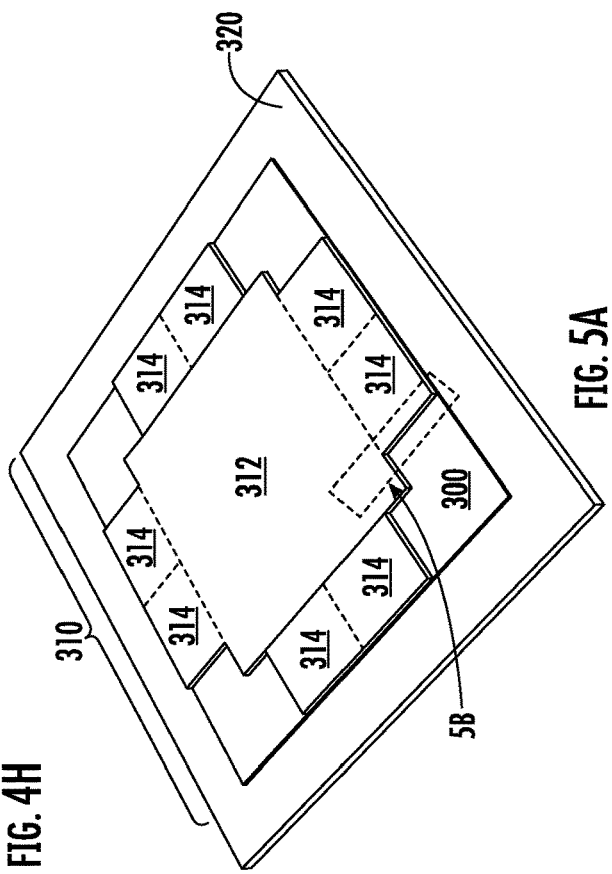

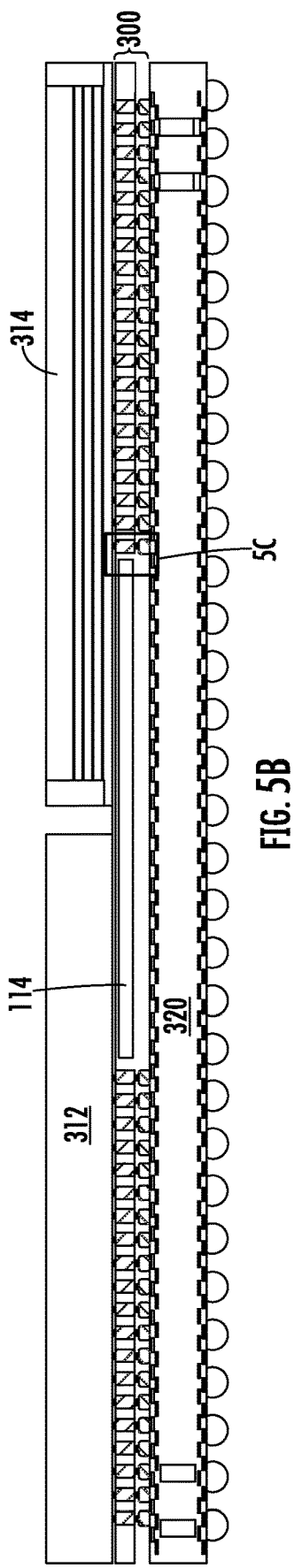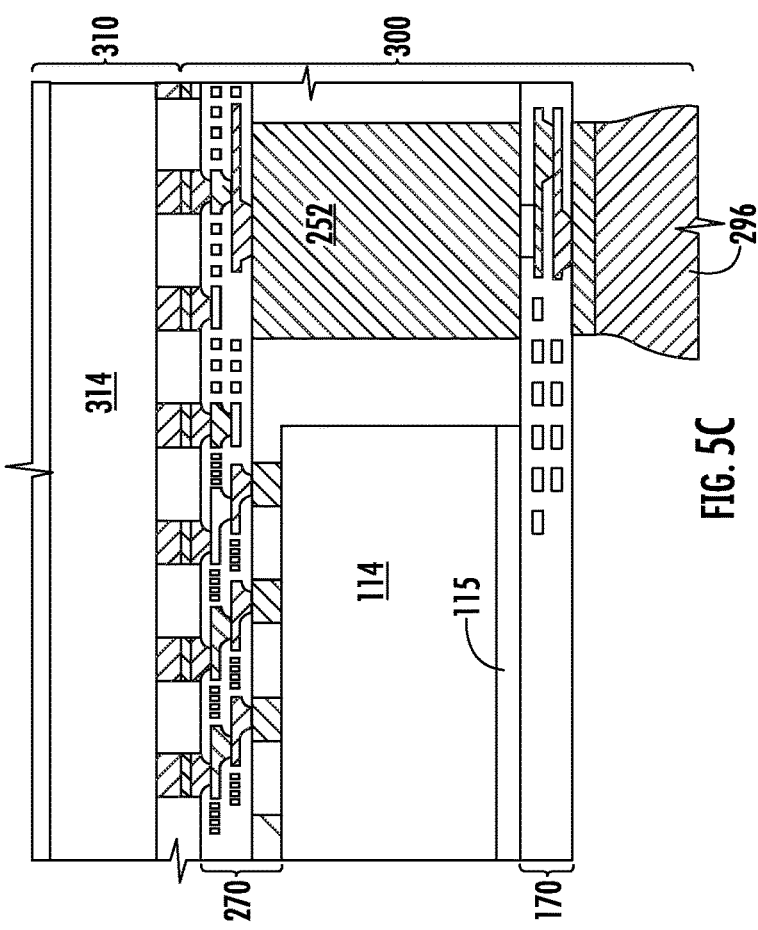

FULLY MOLDED BRIDGE INTERPOSER AND METHOD OF MAKING THE SAME

CROSS-REFERENCE TO RELATED APPLICATIONS

This is a continuation of U.S. Utility patent application Ser. No. 17/581,704, entitled "Fully Molded Bridge Interposer and Method of Making the Same," which was filed on Jan. 21, 2022, which application claims the benefit, including the filing date, of U.S. Provisional Patent No. 63/141,945, entitled "Fully Molded Bridge Interposer and Method of Making the Same," which was filed on Jan. 26, 2021, the disclosures of which are hereby incorporated herein by this reference.

TECHNICAL FIELD

This disclosure relates to a fully molded bridge interposer and methods of making the same.

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, memories, analog to digital or digital to analog converters, power management and charged-coupled devices (CCDs), as well as microelectromechanical systems (MEMS) devices including digital micro-mirror devices (DMDs).

Semiconductor devices perform a wide range of functions such as signal processing, high-speed calculations, transmitting and receiving electromagnetic signals, controlling electronic devices, storing information, and creating visual projections for displays. Semiconductor devices are found in many fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar, complementary metal oxide semiconductors, and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. More recently, back-end manufacturing has been expanded to included emerging technology that allows multiple semiconductor die to be interconnected within a single package or device unit, thereby expanding the conventional definition of back-end technology. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, can be produced more efficiently, have a smaller form factor, and may be less cumbersome when integrated within wearable electronics, portable handheld communication devices, such as phones, and in other applications. In other words, smaller semiconductor devices may have a smaller footprint, a reduced height, or both, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

SUMMARY

An opportunity exists for improved semiconductor manufacturing, packaging, and devices. Accordingly, in an aspect of the disclosure, a semiconductor device may comprise a molded bridge interposer, further comprising a bridge die comprising ultra-high density copper studs with a pitch of less than or equal to 60 µm. Copper posts may be disposed in a periphery of the bridge die and comprise a height greater than or equal to a height of the bridge die and the copper studs. An encapsulant may be disposed on five sides of the bridge die, on sides of the copper studs, and on sides of the copper posts that leave ends of the copper studs and opposing first and second ends of the copper posts exposed from the encapsulant. A backside build-up interconnect structure may be formed over a backside of the bridge die and coupled to first ends of the copper posts. A frontside build-up interconnect structure may be formed over the copper studs of the bridge die and coupled to second ends of the copper posts opposite the first ends of the copper posts. The frontside build-up interconnect structure may comprise ultra-high density pads within a footprint of the bridge die with a pitch less than 60 µm and high density pads with a pitch of greater than or equal to 60 µm outside a footprint of the bridge die. A first via layer of the frontside build-up interconnect structure comprises vias aligned to centers of the copper studs with an $r^2$ value greater than 0.5 relative to difference between an offset between a first side of the bridge die and a copper post adjacent the first side of the bridge die and a second offset between a second side of the bridge die opposite the first side of the bridge die and a copper post adjacent the second side of the bridge die for a lot of devices. A first component may comprise a system on chip (SOC) integrated circuit, memory, memory controller or high bandwidth memory (HBM) controller, voltage regulator, a serializer/deserializer (SERDES), or active semiconductor die. The first component may comprise ultra-high density interconnects coupled with a first portion of the ultra-high density pads within a footprint of the bridge die, and high density interconnects coupled with a first portion of the high density pads outside a footprint of the bridge die. A second component comprising a SOC integrated circuit, memory controller or HBM controller, voltage regulator, SERDES, or active semiconductor die. The second component comprising ultra-high density interconnects coupled with a second portion of the ultra-high density pads within a footprint of the bridge die, and high density interconnects coupled with a second portion of the high density pads outside a footprint of the bridge die.

Particular embodiments of the semiconductor device may further comprise a second bridge die disposed within the molded bridge interposer. The bridge die may further comprise the high density copper studs formed with a pitch of less than or equal 60 µm. The copper posts may be disposed in a periphery of the bridge die at a pitch of 250 µm or less. The molded bridge interposer is disposed over, and is coupled to, a package substrate, a printed circuit board (PCB), a multilayer ceramic capacitors (MLCC), or a passive device.

According to an aspect of the disclosure, a semiconductor device may comprise a bridge die comprising copper studs. Copper posts may be disposed in a periphery of the bridge die. An encapsulant may be disposed on five sides of the bridge die, on sides of the copper studs, and on sides of the copper posts that leave ends of the copper studs and opposing first and second ends of the copper posts exposed from the encapsulant. A frontside build-up interconnect structure may be formed over the copper studs of the bridge die and coupled to second ends of the copper posts opposite the first ends of the copper posts. The frontside build-up interconnect structure comprising first pads at a first pitch within a footprint of the bridge die and second pads at a second pitch outside a footprint of the bridge die.

In another aspect, particular embodiments of the semiconductor device may comprise a first component comprising a SOC integrated circuit, memory controller or HBM controller, voltage regulator, a SERDES, or active semiconductor die, the first component comprising, the first semiconductor device comprising high density interconnects coupled with a first portion of the high density pads, and low density interconnects coupled with a first portion of the low density pads. A second component comprising a SOC integrated circuit, memory controller or HBM controller, voltage regulator, a SERDES, or active semiconductor die, the second component comprising, the second semiconductor device comprising high density interconnects coupled with a second portion of the high density pads, and low density interconnects coupled with a second portion of the low density pads. The semiconductor device may further comprise a backside build-up interconnect structure formed over a backside of the bridge die and coupled to first ends of the copper posts. The first pitch may be less than or equal to 60 µm and the first pitch may be at least 1.5 times less than the second pitch.

The copper posts may comprise a height greater than or equal to a height of the bridge die and the copper studs. For a lot of devices, a first via layer of the frontside build-up interconnect structure may comprise vias aligned to centers of the copper studs with an $r^2$ value greater than 0.5 relative to difference between an offset between a first side of the bridge die and an copper post adjacent the first side of the bridge die and a second offset between a second side of the bridge die opposite the first side of the bridge die and a copper post adjacent the second side of the bridge die. The bridge die may be formed as an active device. The bridge die may be formed with conductive redistribution layers coupled to the copper studs of the bridge die.

According to an aspect of the disclosure, a method of making a semiconductor device may comprise providing a carrier, and disposing copper posts in a periphery of the bridge die. The method may include disposing a bridge die over the carrier, the bridge die comprising copper studs. The method may include forming an encapsulant disposed on five sides of the bridge die, on sides of the copper studs, and on sides of the copper posts that leave ends of the copper studs and opposing first and second ends of the copper posts exposed from the encapsulant. Together, the bridge die, copper posts, and encapsulant form a molded bridge interposer. The method may further comprise forming a frontside build-up interconnect structure over the copper studs of the bridge die and coupled to second ends of the copper posts opposite the first ends of the copper posts. The frontside build-up interconnect structure may comprise first pads at a first pitch within a footprint of the bridge die and second pads at a second pitch outside a footprint of the bridge die. The first pitch may be at least two times less than the second pitch.

In another aspect, particular embodiments of the method of making a semiconductor device may comprise removing at least a portion of the carrier and removing a portion of the encapsulant from over the copper posts and the copper studs. A pitch of the copper studs may be less than or equal to 60 µm, and the first pitch may be at least 1.5 times less than the second pitch. The method may further comprise forming a backside build-up interconnect structure formed over the temporary carrier before disposing the bridge die over the temporary carrier and over the backside build-up interconnect structure. The method may include coupling a first component comprising a SOC integrated circuit, memory controller or HBM controller, voltage regulator, a SERDES, or active semiconductor die to the molded bridge interposer. The first component may comprise interconnects coupled with a first portion of the first pads, and lower density interconnects coupled with a first portion of the second pads. The method may include coupling a second component comprising a SOC integrated circuit, memory controller or HBM controller, voltage regulator, a SERDES, or active semiconductor die. The second component may comprise interconnects coupled with a second portion of the first pads, and lower density interconnects coupled with a second portion of the second pads. For a lot of devices, a first via layer of the frontside build-up interconnect structure may comprise vias aligned to centers of the copper studs with an $r^2$ value greater than 0.5 relative to difference between an offset between a first side of the bridge die and an copper post adjacent the first side of the bridge die and a second offset between a second side of the bridge die opposite the first side of the bridge die and a copper post adjacent the second side of the bridge die.

The foregoing and other aspects, features, applications, and advantages will be apparent to those of ordinary skill in the art from the specification, drawings, and the claims. Unless specifically noted, it is intended that the words and phrases in the specification and the claims be given their plain, ordinary, and accustomed meaning to those of ordinary skill in the applicable arts. The inventors are fully aware that he can be his own lexicographer if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

The foregoing and other aspects, features, and advantages will be apparent to those of ordinary skill in the art from the specification, drawings, and the claims.

BRIEF DESCRIPTION OF THE DRAWINGS

FIGS. 2A-2C illustrate various structures comprising interconnect components or chiplets.

FIGS. 4A-4H illustrate the formation of fully molded bridge interposer comprising the bridge die of FIGS. 3A-3C.

FIGS. 5A-5C illustrate various aspects of fully molded semiconductor structures comprising bridge die as part of a chiplet arrangement and mounted to a substrate.

DETAILED DESCRIPTION

Figure 1A:
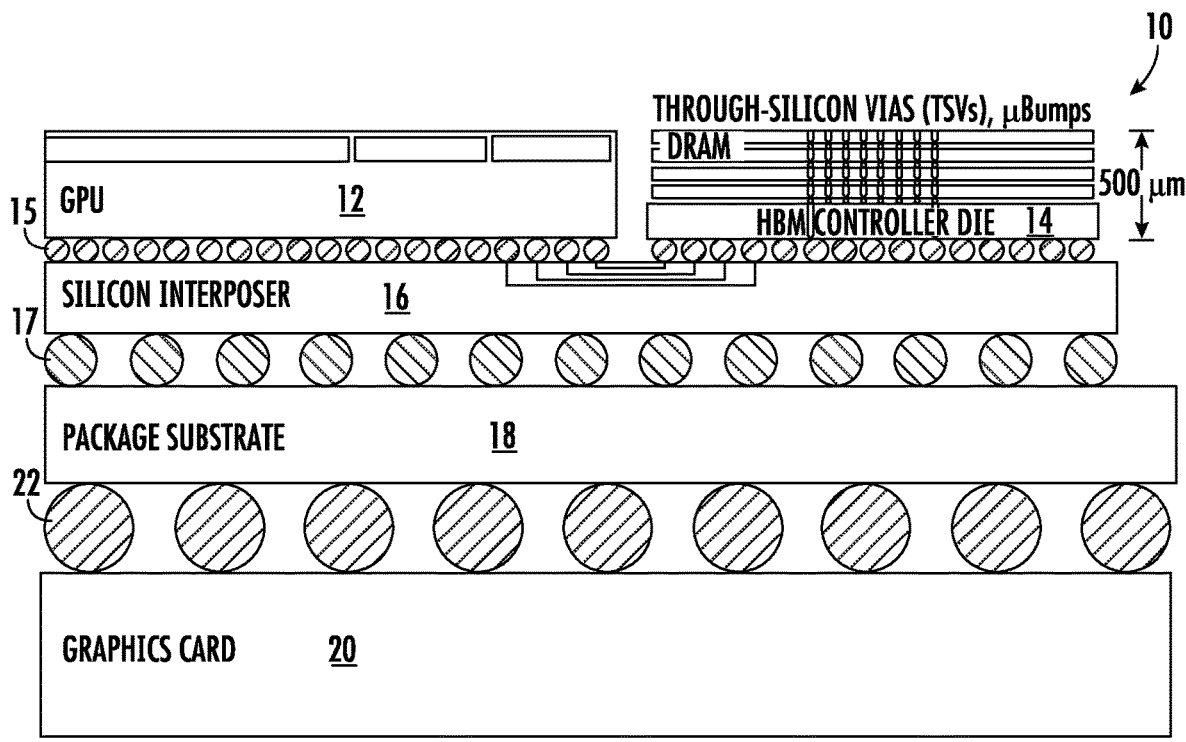
FIGS. 1A-1F illustrate existing semiconductor device designs including bridge interconnects.

This disclosure relates to fully molded semiconductor structures, devices, and packages, and more particularly to a fully molded bridge interposer. In some instances, the fully molded semiconductor structures may comprise routing for semiconductor devices comprising different pitches, such as high density and ultra-high density as described more fully herein.

The fully molded semiconductor structures or bridge interposer (and method for making and using the same) may comprise, or provide: (i) a simplified supply chain, (ii) when compared with a conventional interposer—removing a need for an expensive large silicon die with through silicon vias (TSVs), which can be very large die that are very expensive because (at least in part) because of TSV technology, (iii) when compared with Intel's Embedded Multi-die Interconnect Bridge (EMIB) technology, providing the advantage of no need for specialized substrate technology—a enabling or facilitating the use of a low-cost substrate, (iv) improved electrical performance from using plated Cu Post vs TSVs, (v) have available ultra-high density connections (of or about a 10 μm area array bond pad pitch) where bridge die are embedded, high density (of or about a 20 μm area array bond pad pitch) elsewhere, and (vi) high density connections between bridge die and other devices or packages.

At least some of the above advantages are available at least in part by using unit specific patterning (such as patterning (custom lithography) and build up interconnect structures such as a frontside build-up interconnect structure, which is also known under the trademark "Adaptive Patterning") with respect the bridge die. Unit specific patterning: (i) allows to use high-speed chip attach for bridge die and AP will ensure alignment for high density interconnects between M-Series interposer and attached devices, (ii) aligns via to Cu Studs allowing largest contact vias with smallest studs (fine pitch), (iii) with respect to an interposer makes the molded bridge interposer including a frontside build-up interconnect structure much cheaper that a giant interposer die, (iv) with respect to EMIB, vias can be large compared to stud size and capture pad size, lithography defined vias (not laser drilled), (v) allows connections between devices inside the molded bridge interposer with unit specific patterning or routing to compensate for die shift (including bridge die shift) between embedded devices, which may include memory controllers, voltage regulators, SERDES, etc., and (vi) make embedding active devices more useful.

This disclosure, its aspects and implementations, are not limited to the specific package types, material types, or other system component examples, or methods disclosed herein. Many additional components, manufacturing and assembly procedures known in the art consistent with semiconductor manufacture and packaging are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example" or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

Where the following examples, embodiments and implementations reference examples, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, such as by a stripping process, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the photoresist material are partially removed, so as to provide a pattern or electroplating template for the subsequent formation of structures, such as patterning redistribution layers (RDLs), under bump mentalization (UBM), copper posts, vertical interconnects, or other desirable structures. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle, masks, or direct write imaging design file are transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes or electroplating adds the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed by etching or a layer is added by electroplating. The process of forming, exposing, and removing the photoresist, as well as the process of removing or adding a portion of the semiconductor wafer can be modified according to the particular resist used and the desired results. Negative or positive tones resist can be designed for solvent or base develop solutions.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisoprenes. Removing the soluble portions (i.e. the portions not exposed to light) with chemical solvents or base developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent or a base in the development process. The basic positive photoresist polymer is the phenol-formaldehyde polymer, also called the phenol-formaldehyde novolak resin. Removing the soluble portions (i.e. the portions exposed to light) with chemical solvents or base developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface can be beneficial or required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. Alternatively, mechanical abrasion without the use of corrosive chemicals is used for planarization. In some embodiments, purely mechanical abrasion is achieved by using a belt grinding machine, a standard wafer backgrinder, or other similar machine. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool, laser silicon lattice disruption process or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers, or wirebonds. An encapsulant or other molding material is deposited over the package to provide physical support and electrical isolation. The finished package is then inserted into an electrical system and the functionality of the semiconductor device is made available to the other system components.

Back-end manufacturing as disclosed herein also does more than merely packaging an embedded device or the semiconductor die for structural support and environmental isolation. The packaging described herein further provides non-monolithic electrical interconnection of die for increased functionality & performance. Previously, nearly all advanced semiconductor die were monolithic systems on chips (SoCs) where all electrical interconnect occurred on the silicon wafer during front-end processing. Now, however, work that was traditionally the domain of front-end domain work may be handled or moved to the back-end manufacturing, allowing many semiconductor die (chiplets) to be connected with packaging technology to form a chiplet-based SoC (which is non monolithic) and provides a composite package with greater functionality. The chiplet approach may also decrease waste from defects, increase production efficiency, reliability, and performance.

The electrical system can be a stand-alone system that uses the semiconductor device to perform one or more electrical functions. Alternatively, the electrical system can be a subcomponent of a larger system. For example, the electrical system can be part of a portable hand-held electronic device, such as smart phone, a wearable electronic device, or other video or electronic communication device. Additionally, the electrical system may comprise a graphics component, network interface component, or other signal processing component that can be inserted into a computer or electronics device and may assist with such functions as mobile computing, artificial intelligence, and autonomous functions such as autonomous driving. The semiconductor package can include microprocessors, memories, application specific integrated circuits (ASIC), logic circuits, analog circuits, RF circuits, discrete devices, or other semiconductor die or electrical components. Miniaturization and weight reduction can be beneficial or essential for the products to be accepted by the market. The distance between semiconductor devices must be decreased to achieve higher density.

By combining one or more semiconductor devices, structures, or packages with fan-out technology, manufacturers can incorporate multiple components or elements into more highly compact and integrated electronic devices and systems. Because the semiconductor devices include sophisticated functionality, electronic devices can be manufactured less expensively and as part of a streamlined manufacturing process. The resulting devices are less likely to fail and less expensive to manufacture resulting in a lower cost for consumers.

FIGS. 1A-1F show prior art relative to connecting multiple semiconductor die or semiconductor packages together, that may be used for high intensity or high demand computing, such as computing utilizing or dealing with graphics cards. FIG. 1A illustrates an existing packaging technology or structure 10 comprising a graphics processing unit (GPU 12) coupled to an HBM controller die 14 with bumps or microbumps 15 and through a silicon interposer 16 comprising silicon vias formed in, and extending therethrough. The silicon interposer 16 may then be disposed over and coupled to a package substrate 18, with conductive or solder interconnects, bumps, or balls 17. The package substrate 18 may then be disposed over and coupled to a graphics card or PCB 20 with conductive or solder interconnects, bumps, or balls 22. The graphics card 20 may comprise a multi-layer PCB, and the conductive bumps 20 may be used for: display connections, electrical current, as well as for peripheral component interconnect express (PCIe) interconnections or high-speed serial computer expansion bus connections.

Figure 1B:
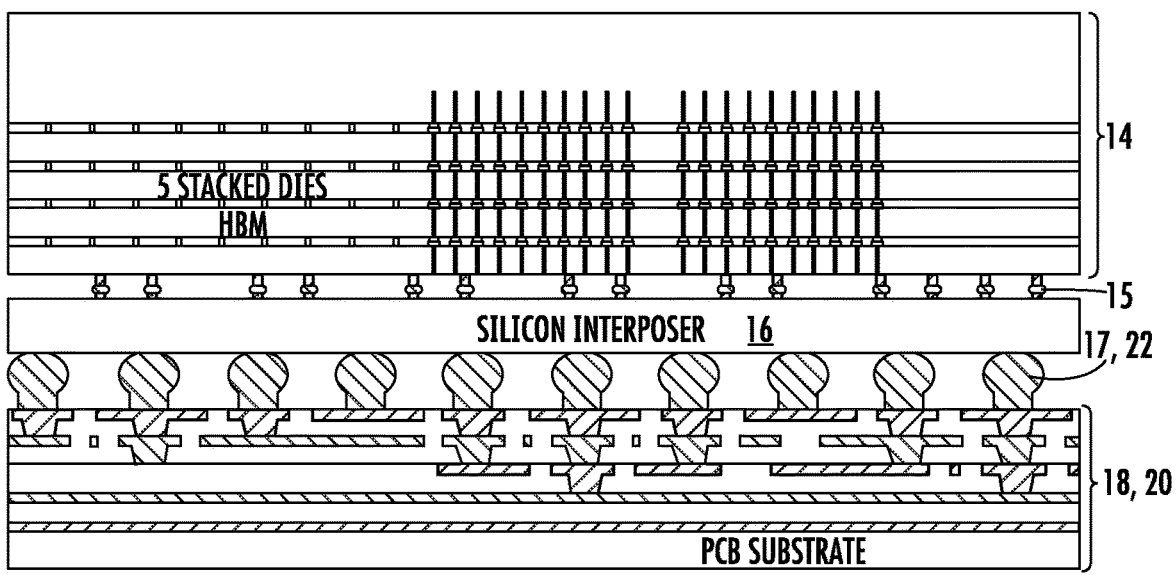

FIG. 1B illustrates a representation of a cross-section structure 11 that could be seen by a scanning electron microscope (SEM) of an HBM 14 stacked on—and coupled to—a silicon interposer 16, which may further be coupled to a substrate, PCB, or graphics card 20. The structure 11 integrates HBM memories 14 (which may comprise DRAM die and Logic Die connected with via-middle TSV and micro-bumps) and the GPU 12 stacked onto the silicon interposer 16, wherein the silicon interposer 16 comprises via-middle through silicon vias (TSVs).

FIGS. 1C-1F illustrates an existing technology of Intel's Embedded Multi-die Interconnect Bridge (EMIB) 30, that was developed to provide a cost-effective approach to in-package high density interconnect of heterogeneous chips or semiconductor die 32.

Figure 1C:
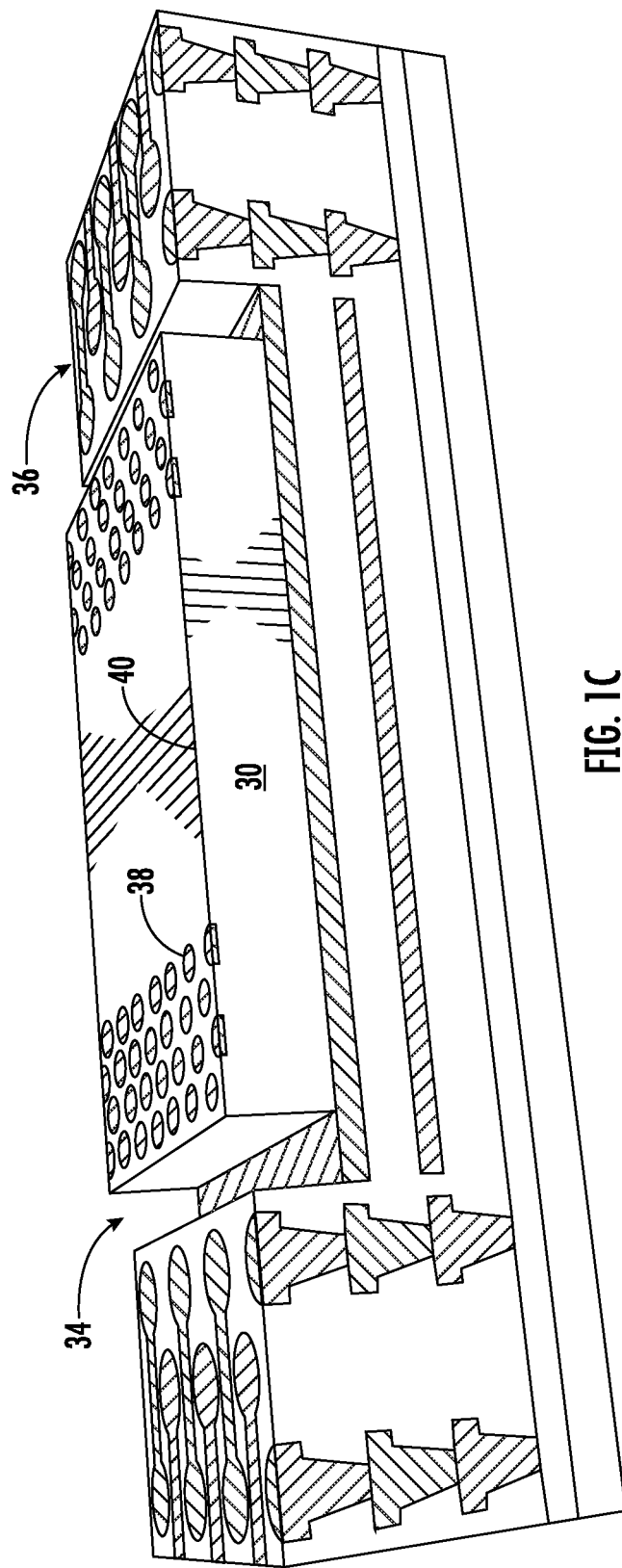
Figure 1D:
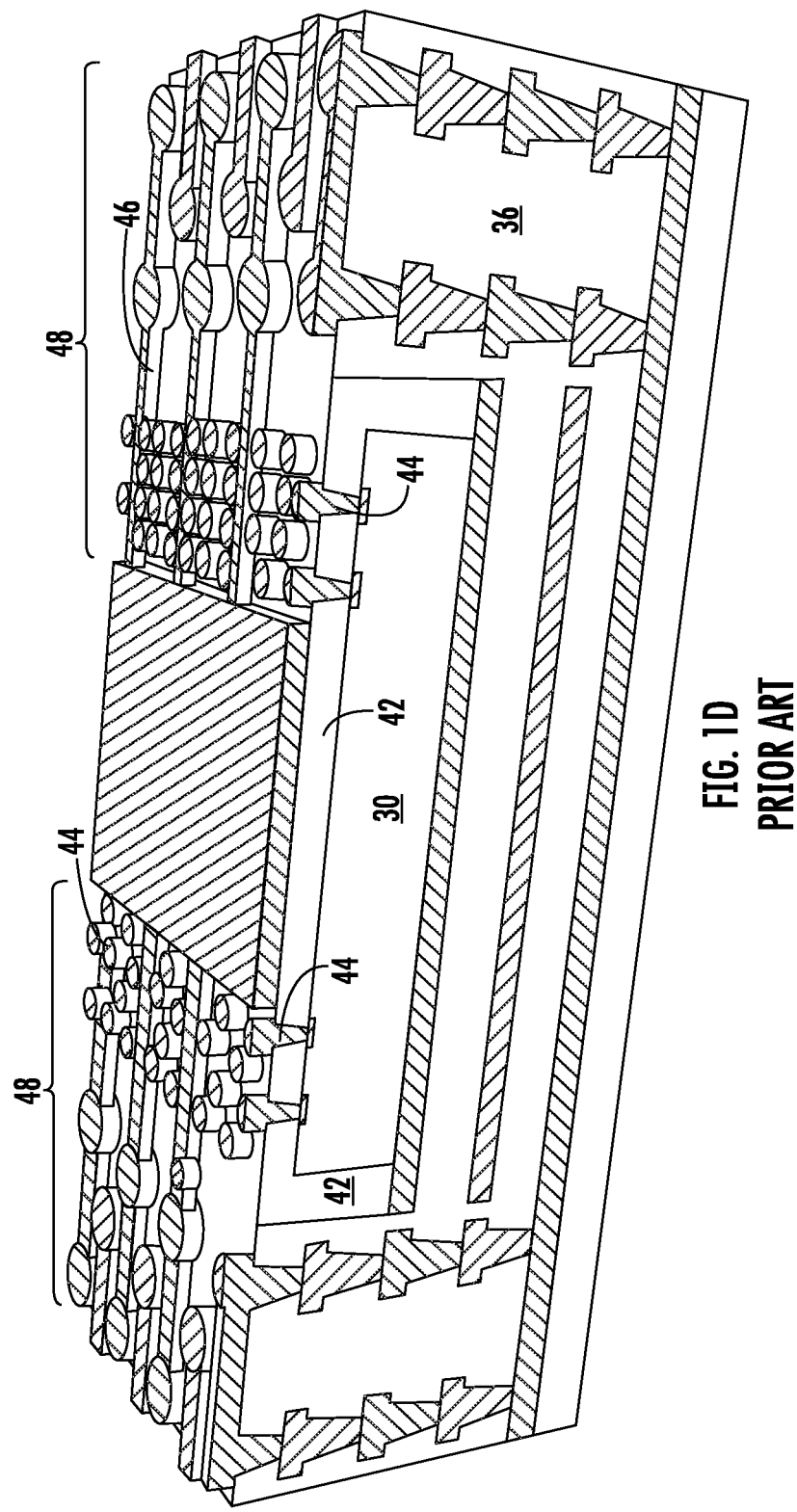
Figure 1E:
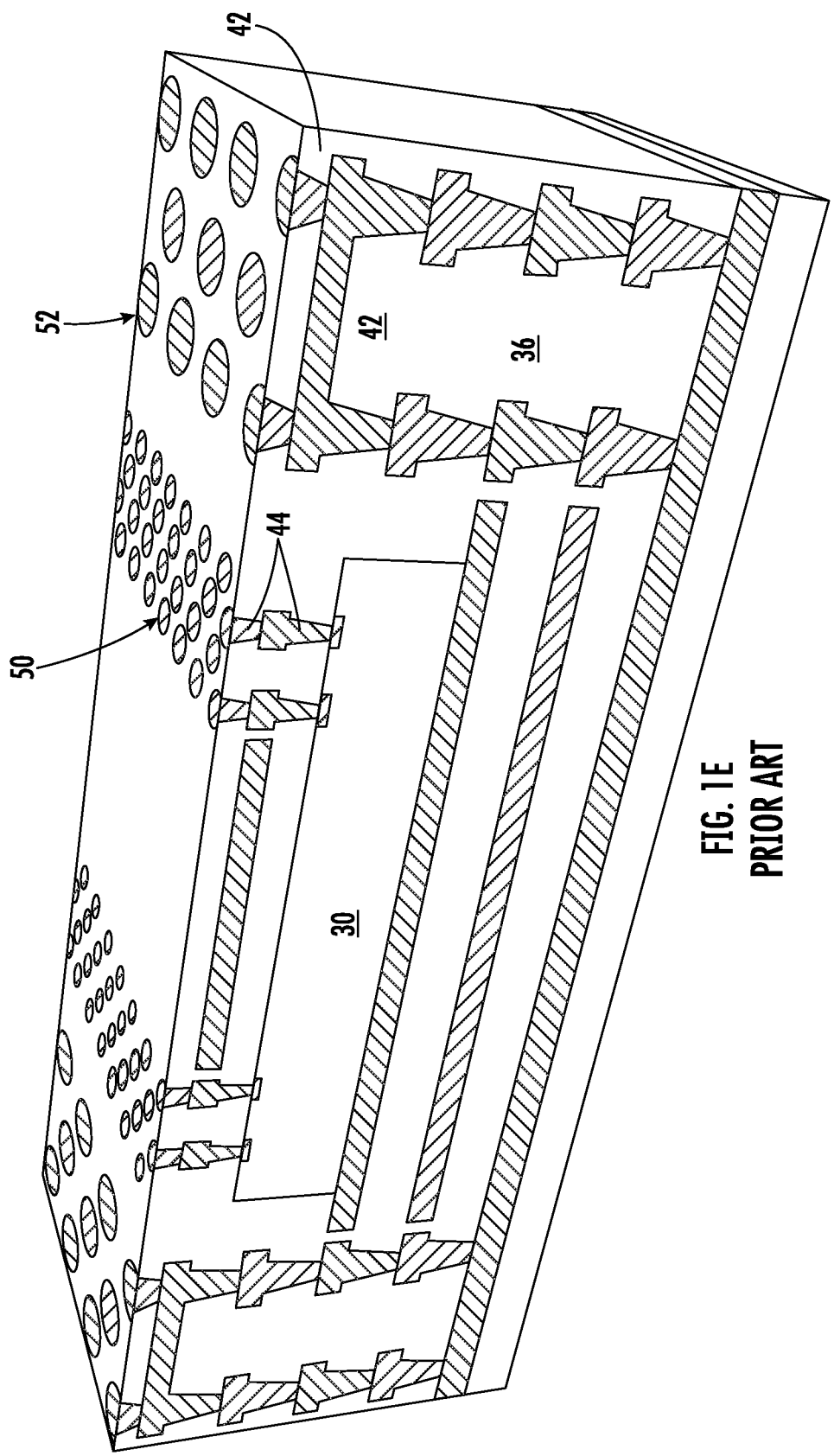
Figure 1F:
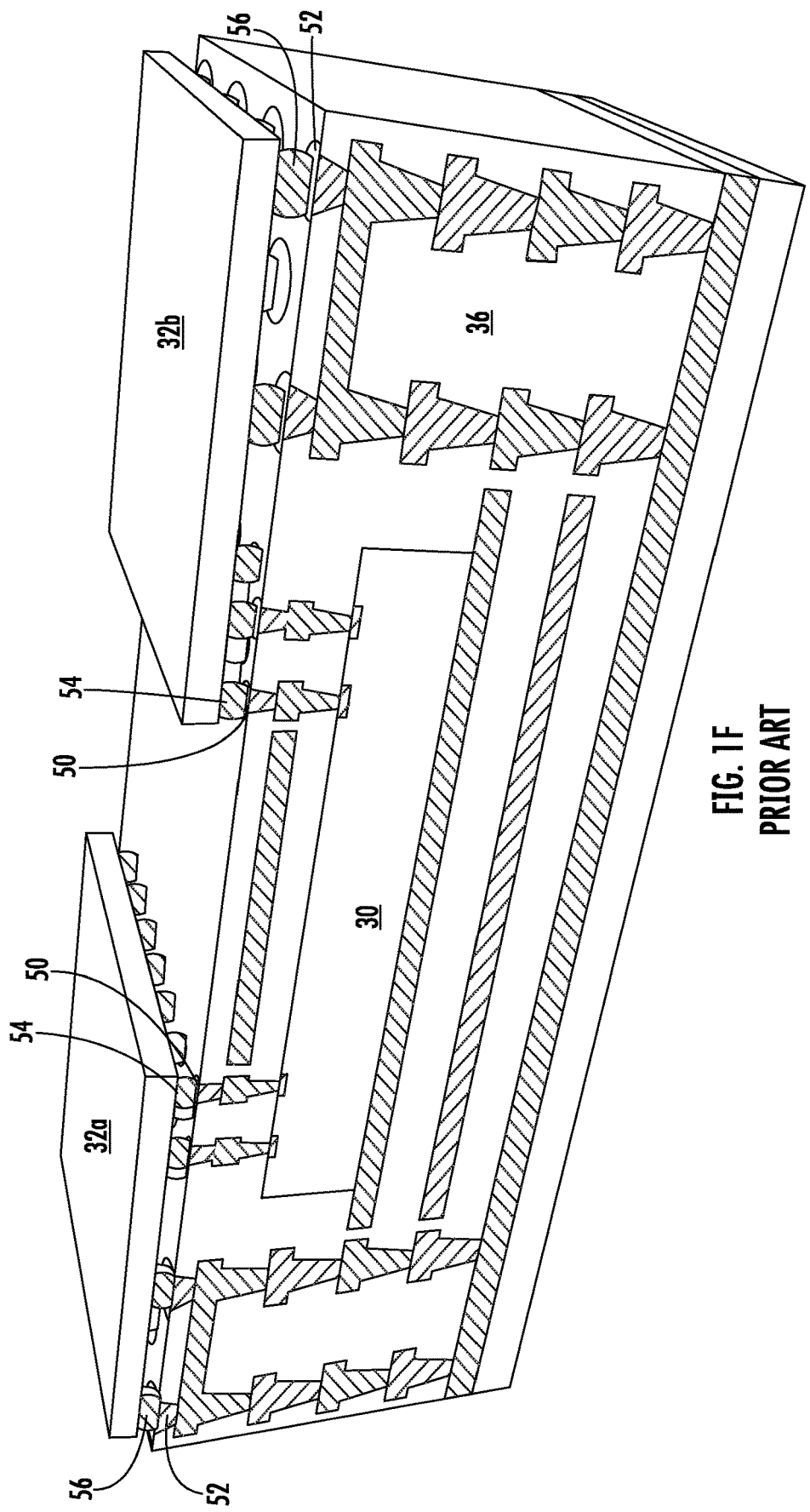

FIG. 1C illustrates the EMIB 30 embedded in a cavity 34 of an organic substrate 36, the EMIB 30 comprises conductive pads or contact pads 38 coupled together with a conductive redistribution layer (RDL) 40. FIG. 1D illustrates resin 42 formed over the EMIB 30, and vias 44 formed in, or extending through, the resin 42 with the vias 44 further coupled with the EMIB 30. RDLs 46 may be formed over the resin 42 and over the EMIB 30 and coupled with the vias 44 for lateral connection that extend from the EMIB 30 and vias 44 to mounting sites 48 for heterogeneous chips 32. FIG. 1E illustrates additional vias 44 and layers of resin 42 formed over the EMIB 30 with contact pads for microbumps 50 formed over the EMIB 30 and contact pads for ordinary bumps 52 formed at semiconductor die mounting sites 48. FIG. 1F illustrates a first semiconductor die 32a on the left and a second semiconductor die 32b on the right, each mounted over respective semiconductor die sites 48 with microbumps 54 and ordinary bumps 56 and RDLs 40, 46 and vias 44 for routing of signals and interconnections for the semiconductor die 32a, 32b being routed through the organic substrate 36 and through the EMIB 30.

FIGS. 2A-2C illustrate a chiplet 60 or grouping of multiple semiconductor die, semiconductor chips, or semiconductor devices 62 interconnected and molded together. FIG. 2A illustrates a chiplet 60 (without encapsulant) comprising a central, larger, semiconductor die, semiconductor chip, or semiconductor device 62, with multiple, additional, smaller semiconductor die 64 to show the multiple semiconductor die, semiconductor chips, or semiconductor devices 64 disposed around and grouped together with semiconductor device 62, such as in a fan-out arrangement. Chip type or function of the various semiconductor die 62, 64 within the chiplet 60 may comprise a central processing unit (CPU), a modem, a graphics processing unit (GPU), chips, semiconductor die, or processors specialized for running artificial intelligence (AI) algorithms, chips, semiconductor die or processors specialized for input/output (I/O), Serializer/Deserializer (SERDES) devices, and various other memory devices such as chips or semiconductor die specialized for Cache or storing data, and chips specialized for high bandwidth memory (HBM) or high-speed computer memory. FIGS. 2B and 2C illustrate the same or similar chiplet 60 shown in FIG. 2A overmolded with encapsulant material and in a fan-out arrangement. In FIG. 2C, the overmolded semiconductor die chiplet 60 is coupled to, or disposed over (or on) a substrate or package substrate 66, which may be further coupled to, or mounted on, a motherboard, a printed circuit board (PCB), an interposer, or another semiconductor device or package. The method and device described herein may be advantageously used for applications in which the device is mounted to a substrate, and may also be used for instances in which it is not mounted to a substrate, like for applications within a handheld mobile electronic device, such as a smartphone or other wearable technology.

Figure 3A:
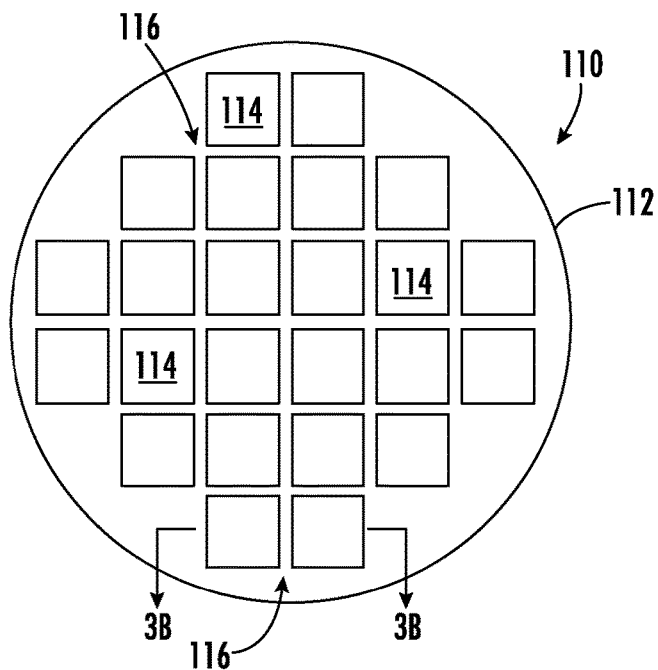
FIGS. 3A-3C illustrate bridge die comprising electrical interconnects being singulated from a native wafer.
Figure 3B:
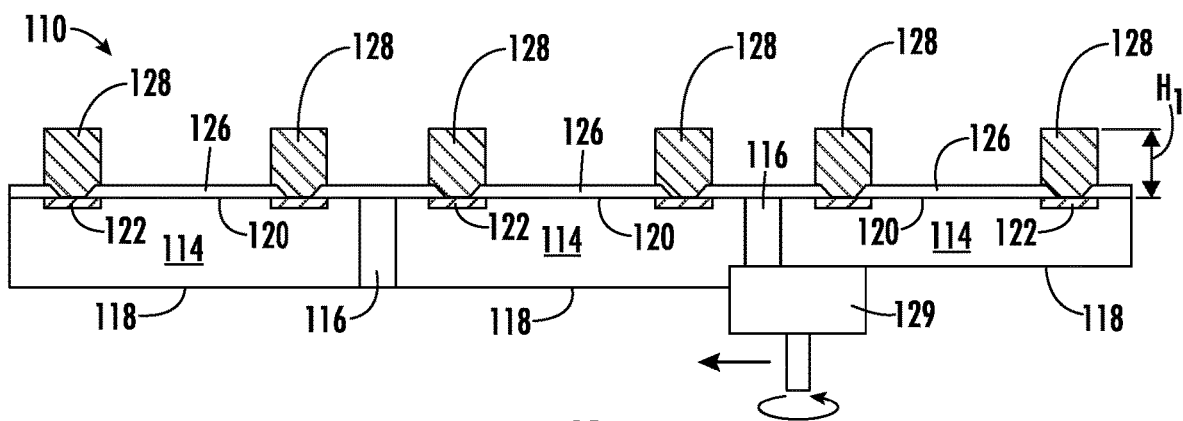
Figure 3C:
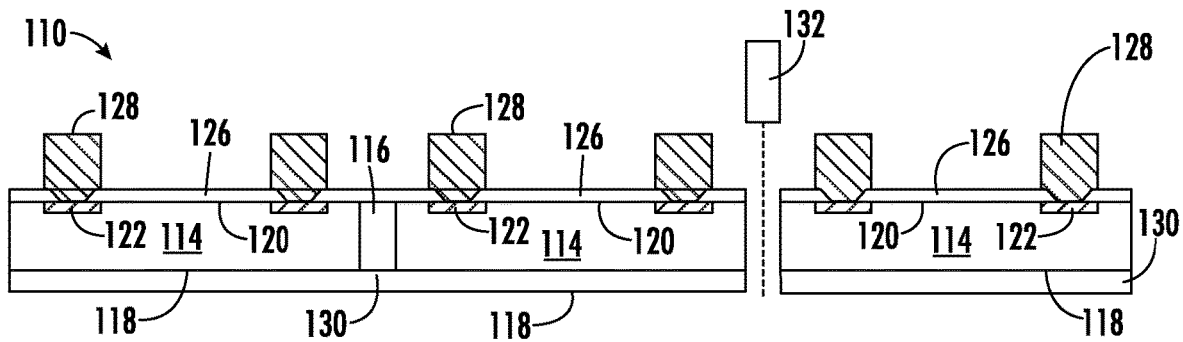

FIGS. 3A-3C show various views of a semiconductor wafer 110 and the formation and separation of individual semiconductor die 114 therefrom. FIG. 3A illustrates a plan view of a semiconductor wafer or native wafer 110 with a base substrate material 112, such as, without limitation, silicon, germanium, gallium arsenide, indium phosphide, or silicon carbide, for structural support. A plurality of semiconductor die or components 114 can be formed on wafer 110 separated by a non-active, inter-die wafer area or saw street 116 as described above. The saw street 116 can provide cutting areas to singulate the semiconductor wafer 110 into the individual semiconductor die 114.

Each semiconductor die 114 may comprise a backside or back surface 118 and an active surface 120 opposite the backside 118. The active surface 120 may contain analog or digital circuits implemented as active devices, passive devices, conductive layers, and dielectric layers formed within the die and electrically interconnected according to the electrical design and function of the semiconductor die 114. For example, the circuit may include one or more transistors, diodes, and other circuit elements formed within active surface to implement analog circuits or digital circuits, such as DSP, ASIC, memory, or other signal processing circuits. The semiconductor die 114 may also contain IPDs such as inductors, capacitors, and resistors, such as for power management, RF signal processing, and clocking or other functions. The semiconductor die 114 may be formed on a native wafer in a wafer level process as one of many packages being formed simultaneously on a carrier. In other instances, the semiconductor die 114 may be formed as part of a reconstituted wafer, and may comprise multiple die molded together. The semiconductor die 114 may also be another suitable embedded device, which is subsequently formed within the fully-molded bride interposer 300, and surrounded (partially or entirely) by encapsulant 256. The semiconductor die 114 within the fully molded bridge interposer 300 may be an active die, a bridge die, and in other instances may be formed without an active surface, and with copper studs of the bridge die electrically connected or coupled with wiring, routing, or RDLs.

FIG. 3B. illustrates a cross sectional sideview of the wafer 110, as shown taken along the section line 3B-3B in FIG. 3A. FIG. 3B also illustrates an optional dielectric, insulating. or passivation layer 126 conformally applied over the active surface 120 and over conductive layer 122. Insulating layer 126 can include one or more layers that are applied using PVD, CVD, screen printing, spin coating, spray coating, sintering, thermal oxidation, or other suitable process. Insulating layer 126 can contain, without limitation, one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), polymer, polyimide, benzocyclobutene (BCB), polybenzoxazoles (PBO), or other material having similar insulating and structural properties. Alternatively, semiconductor die 114 are packaged without the use of any PBO layers, and insulating layer 126 can be formed of a different material or omitted entirely. In another embodiment, insulating layer 126 includes a passivation layer formed over the active surface 120 without being disposed over conductive layer 122. When insulating layer 126 is present and formed over conductive layer 122, openings are formed completely through insulating layer 126 to expose at least a portion of conductive layer 122 for subsequent mechanical and electrical interconnection. Alternatively, when insulating layer 126 is omitted, conductive layer 122 is exposed for subsequent electrical interconnection without the formation of openings.

FIG. 3B also illustrates conductive bumps, conductive interconnects, or electrical interconnect structures 128 that can be formed as columns, pillars, posts, thick RDLs, bumps, or studs that are formed of copper or other suitable conductive material, which are disposed over, and coupled or connected to, conductive layer 122. When formed as posts 128, the posts will have a height greater than a thickness, whereas a pillar has a tin cap and a stud is wider than it is tall. Conductive bumps 128 can be formed directly on conductive layer 122 using patterning and metal deposition processes such as printing, PVD, CVD, sputtering, electrolytic plating, electroless plating, metal evaporation, metal sputtering, or other suitable metal deposition process. Conductive bumps 128 can be one or more layers of Al, Cu, Sn, Ni, Au, Ag, palladium (Pd), or other suitable electrically conductive material and can include one or more layers. In some instances, one or more UBM layers of Al, Cu, Sn, Ni, Au, Ag, Pd, or other suitable electrically conductive material can optionally be disposed between conductive layer 122 and conductive bumps 128. In some embodiments, conductive bumps 128 can be formed by depositing a photoresist layer over the semiconductor die 114 and conductive layer 122 while the semiconductor die 114 are part of the semiconductor wafer 110. A portion of the photoresist layer can be exposed and removed by an etching development process, and the conductive bumps 128 can be formed as copper pillars in the removed portion of the photoresist and over conductive layer 122 using a selective plating process. The photoresist layer can be removed leaving conductive bumps 128 that provide for subsequent mechanical and electrical interconnection and a standoff with respect to active surface 120. Conductive bumps 128 can include a height H1 in a range of 5-100 micrometers (μm) or a height in a range of 20-50 μm, or a height of about 25 μm.

FIG. 3B also illustrates the semiconductor wafer 110 can undergo an optional grinding operation with a grinder 129 to planarize the surface and reduce a thickness of the semiconductor wafer 110. A chemical etch can also be used to remove and planarize a portion of the semiconductor wafer 110.

FIG. 3C illustrates attaching a die attach film (DAF) 130 to the semiconductor wafer 110 that can be disposed over, and in direct contact with, the backsides 118 of the semiconductor die 114. The DAF 130 can comprise epoxy, thermal epoxy, epoxy resin, B-stage epoxy laminating film, ultraviolet (UV) B-stage film adhesive layer, UV B-stage film adhesive layer including acrylic polymer, thermo-setting adhesive film layer, a suitable wafer backside coating, epoxy resin with organic filler, silica filler, or polymer filler, acrylate based adhesive, epoxy-acrylate adhesive, a polyimide (PI) based adhesive, or other adhesive material.

FIG. 3C also illustrates semiconductor wafer 110 can be singulated through gaps or saw streets 116 using laser grooving, a saw blade or laser cutting tool 132, or both to singulate the semiconductor wafer 110 into individual semiconductor die 114 with conductive bumps 128. The semiconductor die 114 can then be used as part of a subsequently formed semiconductor component package as discussed in greater detail below with respect to FIGS. 4A-4H.

FIGS. 4A-5C, illustrate a structure, method, process flow for forming the semiconductor device or molded bridge interposer that may comprise a bridge die and peripheral posts. FIG. 4A illustrates providing a temporary carrier or substrate 140, on which subsequent processing of the fully-molded bridge interposer 300 can occur, as described in greater detail herein. Carrier 140 may be a temporary or sacrificial carrier or substrate, and in other instances may be or a reusable carrier or substrate. The carrier 140 may be of any desirable or suitable size, including a circular shape comprising a diameter of 300 mm.

The carrier 140 can contain one or more base materials formed in one or more layers, which may comprise base materials such as metal, silicon, polymer, polymer composite, ceramic, perforated ceramic, glass, glass epoxy, stainless steel, mold compound, mold compound with filler, or other suitable low-cost, rigid material or bulk semiconductor material for structural support. When a UV release is used with a temporary carrier 140, the carrier 140 may comprise one or more transparent or translucent materials, such as glass. When a thermal release is used with a temporary carrier 140, the carrier 140 may comprise opaque materials. The carrier 140 can be circular, square, rectangular, or other suitable or desirable shape and can include any desirable size, such as a size equal to, similar to, or slightly larger or smaller than a reconstituted wafer or panel that is subsequently formed on or over the carrier 140. In some instances, a diameter, length, or width of the temporary carrier can be equal to, or about, 200 millimeters (mm), 300 mm, or more.

The carrier 140 can comprise a plurality of semiconductor die mounting sites or die attach areas 142 spaced or disposed across a surface of the carrier 140, according to a design and configuration of the final fully-molded bridge interposer semiconductor devices 300, to provide a peripheral area or space 143. The peripheral area 143 can partially or completely surround the die attach areas 142 to provide space for subsequent vertical, through package interconnections, and an area for fan-out routing or build-up interconnect structures. For example, the peripheral area 143 can surround, or be offset from, one side of the semiconductor die 114, or more than one side of the semiconductor die 114, such as 2, 3, 4, or more sides of the semiconductor die 114.

When a temporary carrier 140 is used, an optional release layer, interface layer or double-sided tape 144 can be formed over carrier 140 as a temporary adhesive bonding film or etch-stop layer. The release layer 144 may be a film or laminate, and may also be applied by spin coating or other suitable process. The temporary carrier can be subsequently removed by strip etching, chemical etching, mechanical peel-off, CMP, plasma etching, thermal, light releasing process, mechanical grinding, thermal bake, laser scanning, UV light, or wet stripping.

FIG. 4A further illustrates forming a build-up interconnect structure 170 over the carrier 140 to electrically connect, and provide routing between, conductive interconnects 252, the conductive bumps 128, and other device mounted on, or coupled with, the fully-molded bridge interposer 300. While the build-up interconnect structure 170 is shown comprising three conductive layers and three insulating layer, a person of ordinary skill in the art will appreciate that fewer layers or more layers can be used depending on the configuration and design of the fully-molded bridge interposer or semiconductor device 300. The build-up interconnect structure 170 can optionally comprise a first insulating or passivation layer 172 formed or disposed over the carrier 140. The first insulating layer 172 can comprise one or more layers of $SiO_2$, $Si_3N_4$, SiON, $Ta_2O_5$, $Al_2O_3$, polymer, polyimide, BCB, PBO, or other material having similar insulating and structural properties. The insulating layer 172 can be formed using PVD, CVD, printing, spin coating, spray coating, sintering or thermal oxidation. Openings or first level conductive vias can be formed through the insulating layer 172 for subsequent interconnection with bumps 296.

A first conductive layer 174 can be formed over the substrate 140 and over the first insulating layer 172 as a first RDL layer to extend through the openings in the first insulating layer 172, to electrically connect with the first level conductive vias, and to electrically connect with the conductive bumps 128 and the conductive interconnects 252. Conductive layer 174 can be one or more layers of Al, Cu, Sn, Ni, Au, Ag, or other suitable electrically conductive material formed using a patterning and metal deposition process such as sputtering, electrolytic plating, and electroless plating, or other suitable process.

A second insulating or passivation layer 176, which can be similar or identical to the first insulating layer 172, can be disposed or formed over the substrate 140, the first conductive layer 174, and the first insulating layer 172. An opening or second level conductive via can be formed through the second insulating layer 176 to connect with the first conductive layer 174.

A second conductive layer 178, when desirable and when present, may be similar or identical to the first conductive layer 174, can be formed as a second RDL layer over substrate 140, over the first insulating layer 172, over the first conductive layer 174, over the second level conductive via, or within an opening of the second insulating layer 172, to electrically connect with the first conductive layer 174, the first level and second level conductive vias, and the semiconductor die 114.

A third insulating or passivation layer 180, when desirable and when present, may be similar or identical to the first insulating layer 172, can be disposed or formed over the second conductive layer 178 and the second insulating layer 176. An opening or a third level conductive via can also be formed in or through the third insulating layer 280 to connect with the second conductive layer 178.

A third conductive layer 182, when desirable and when present, may be similar or identical to the second conductive layer 178, can be formed as a third RDL layer—or as vias or vertical interconnects through the third insulating layer 180—and further disposed over the second insulating layer 176, over the second conductive layer 178, over the second level conductive via, or within an opening of the second insulating layer 176, to electrically connect with the second conductive layer 178, and the semiconductor die 114.

FIG. 4B further illustrates forming a seed layer 190 over the build-up interconnect structure 170. The seed layer 190 can be one or more layers of Al, Cu, Sn, Ni, Au, Ag, Titanium (Ti), Tungsten (W) or other suitable electrically conductive material. In some instances, the seed layer 190 will be, or may include, Ti/Cu, TiW/Cu, W/Cu or a coupling agent/Cu. The formation, placement, or deposition of the seed layer 190 can be with PVD, CVD, electrolytic plating, electroless plating, or other suitable process. The seed layer 190 can be deposited by sputtering, electroless plating, or by depositing laminated foil, such as Cu foil, combined with electroless plating.

Figure 4C:
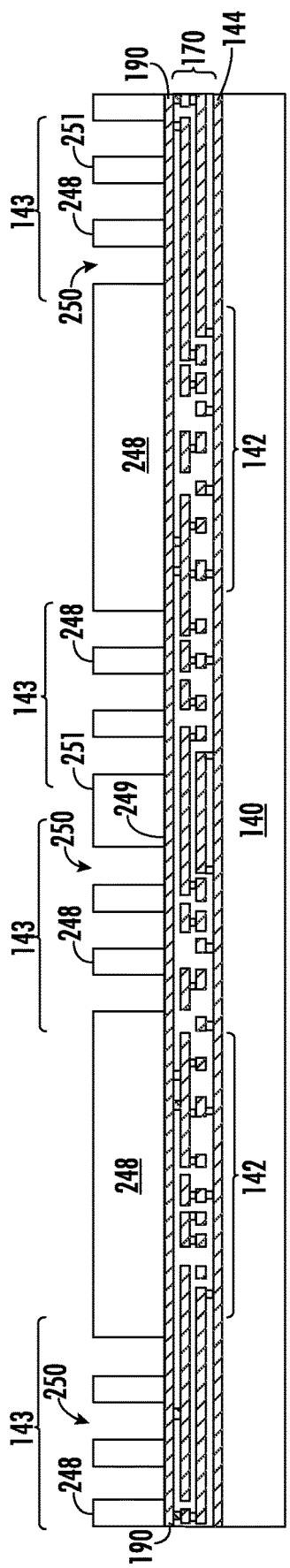

FIG. 4C illustrates forming or depositing a resist layer or photosensitive layer 248 over and directly contacting seed layer 190, over build-up interconnect structure 170, and over the temporary carrier 140. After formation of the resist layer 248 over the temporary carrier, the resist layer 248 can then be exposed and developed to form openings 250 in the resist layer 248. In some instances, more than one photoresist layer 248 may be used. Openings 250 may be formed in the photoresist 248, and can be positioned over, or within a footprint of, the peripheral area 143 of the carrier 140. The openings 250 can extend completely through the resist layer 248, such as from a first surface or bottom surface 249 of the resist layer 248 to second surface or top surface 251 of the resist layer 248 opposite the first surface 249. An after development inspection (ADI) of the developed resist layer 248 and the openings 250 can be performed to detect the condition or quality of the openings 250. After the ADI of resist layer 248 and openings 250, a descum operation can be performed on the developed resist layer 248.

Figure 4D:
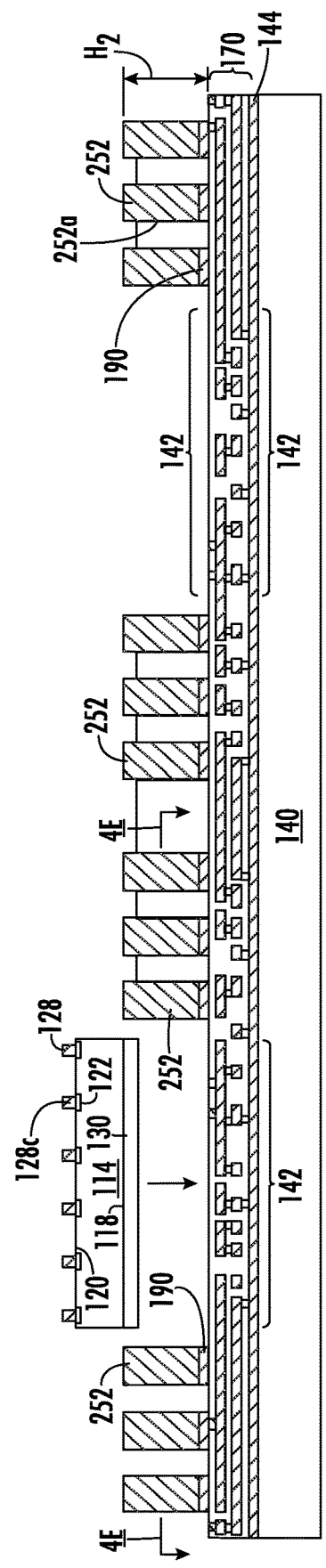

FIG. 4D shows the formation of a plurality of conductive interconnects 252 that were formed within the openings 250 in resist layer 248. The conductive interconnects 252 can be formed as columns, pillars, posts, bumps, or studs that are formed of copper or other suitable conductive material. Conductive interconnects 252 can be formed using patterning and metal deposition processes such as printing, PVD, CVD, sputtering, electrolytic plating, electroless plating, metal evaporation, metal sputtering, or other suitable metal deposition process. When conductive interconnects 252 are formed by plating, the seed layer 190 can be used as part of the plating process. Conductive interconnects of posts 252 can be one or more layers of Al, Cu, Sn, Ni, Au, Ag, Pd, solder, or other suitable electrically conductive material and can include one or more layers.

After formation of the conductive interconnects 252, the resist layer 248 can be removed, such as by a stripping process, leaving conductive interconnects 252 in the peripheral area 143 around the semiconductor die mounting sites 142 to provide for subsequent vertical or three dimensional (3D) electrical interconnection for the fully-molded bridge interposer 300. Conductive interconnects 252 can include a height H2 in a range of 80-300 μm or a height in a range of 100-150 μm, or a height thereabout. In other instances, conductive vertical interconnects 252 may include a height in a range of 10-600 μm, 60-100 μm, 70-90 μm, or about, 80 μm. As used herein, "thereabout," "about," or "substantially" means a percent difference in a range of 0-5%, 1-10%, 1-20%, 1-30%, or 1-50% of the number or range indicated.

After removal of the resist layer 248, the semiconductor die mounting sites 142 on or over the temporary carrier 140, the build-up interconnect structure 170, or both, can be exposed and ready to receive the semiconductor die 114. The orientation of semiconductor die 114 can be either face up with active surface 120 oriented away from the temporary carrier 140 to which the semiconductor die 114 are mounted, or alternatively can be mounted face down with the active surface 120 oriented toward the temporary carrier 140 to which the semiconductor die 114 are mounted. After mounting the semiconductor die 114 to the temporary carrier 140 in a face up orientation, the DAF 130 can undergo a curing process to cure the DAF 130 and to lock the semiconductor die 114 in place to the build-up interconnect structure 70 and over the temporary carrier 140.

Figure 4E:
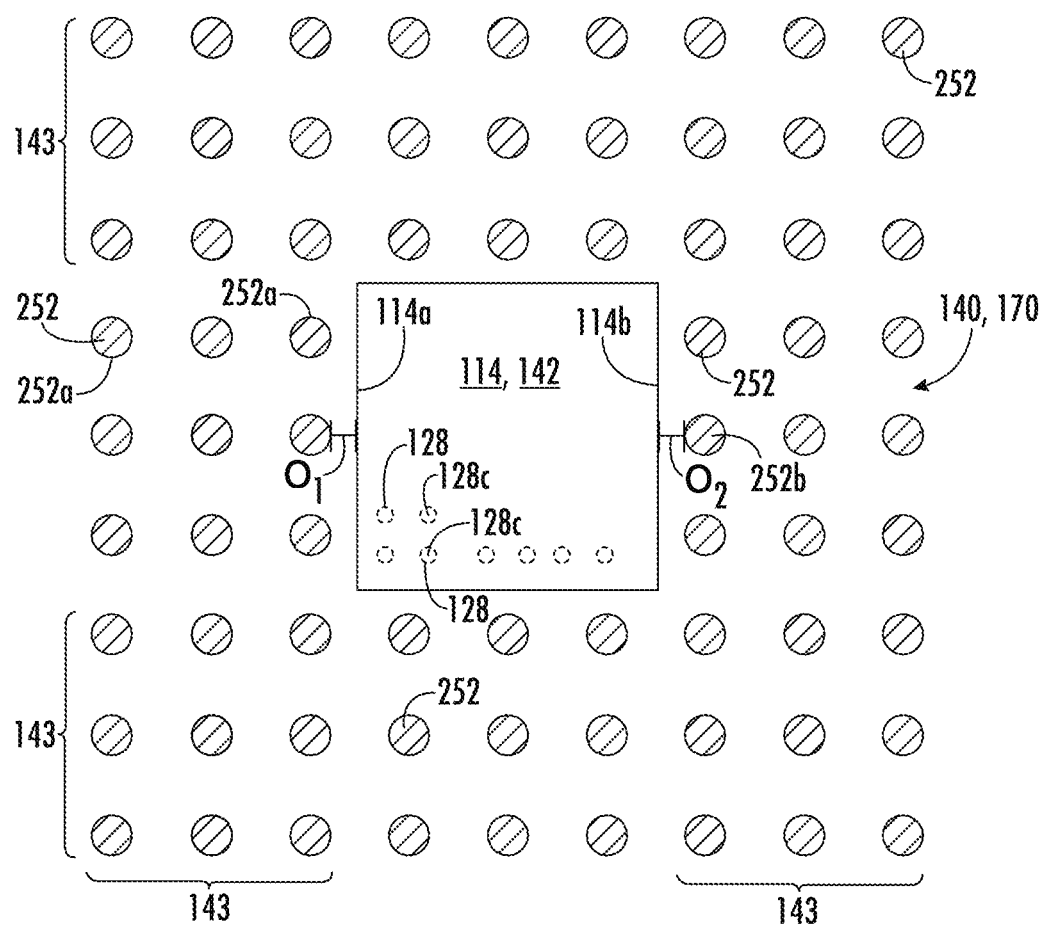

FIG. 4E shows a top or plan view of a portion of the temporary carrier 140 and the conductive interconnects 252 taken along the section line 4E from FIG. 4D. FIG. 4E shows that the conductive interconnects 252 can be formed within, and extend intermittently across, the peripheral area 143 and surround the semiconductor die mounting sites 142 (and the semiconductor die 114) without being formed within the semiconductor die mounting sites 142. Additionally, FIG. 4E shows that after the semiconductor die 114 is mounted at the mounting side 142, a first side 114a of semiconductor die 114 is offset by an offset $O_1$ from the conductive posts 252 adjacent the first side 114a. A second side 114b of semiconductor die 114 (which is opposite the first side 114a) is offset by an offset $O_2$ from the conductive posts 252 adjacent the first side 114b.

Figure 4F:
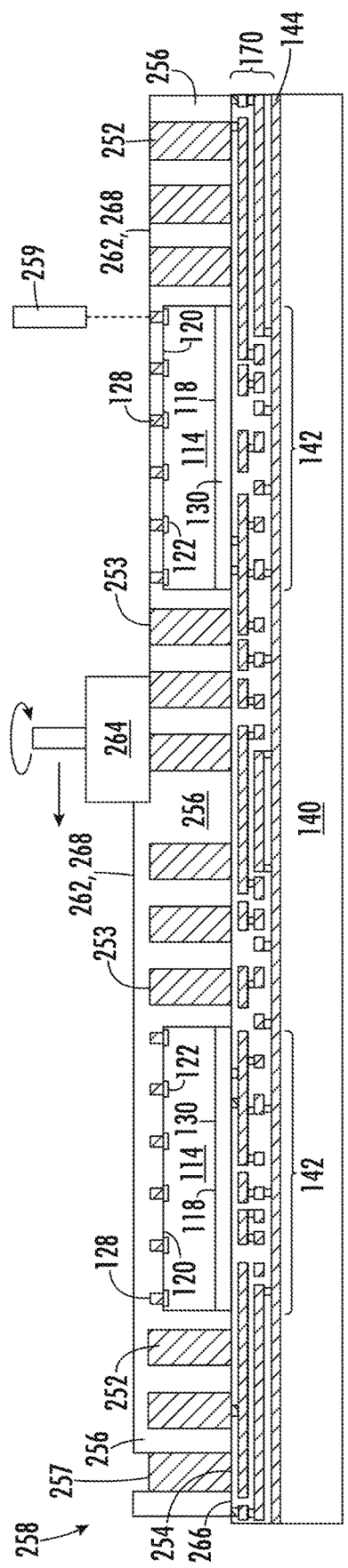
Figure 4G:
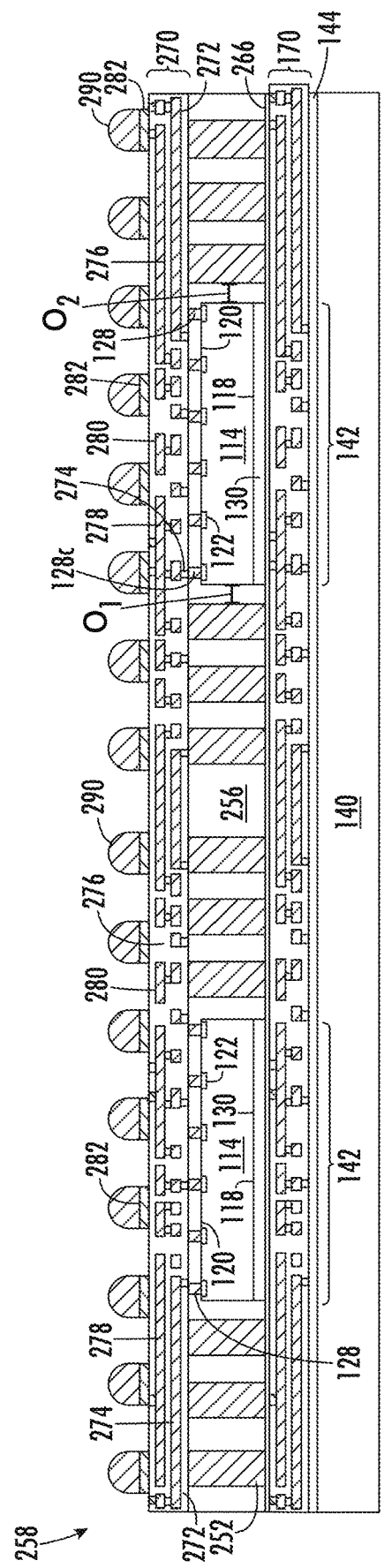

FIG. 4F, continuing from FIGS. 4D and 4E, illustrates that after mounting the semiconductor die 114 to the carrier 140, a mold compound or encapsulant 256 can be deposited around the plurality of semiconductor die 114 using a paste printing, compression molding, transfer molding, liquid encapsulant molding, lamination, vacuum lamination, spin coating, or other suitable applicator. The encapsulant 256 can be a polymer composite material, such as epoxy resin with filler, epoxy acrylate with filler, PBO, polyimide, polymer with or without proper filler. Semiconductor die 114 can be embedded in encapsulant 256, which can be non-conductive and environmentally protect the semiconductor die 114 from external elements and contaminants. The encapsulant 256 can be formed as a single encapsulant in a single step adjacent to and directly contacting all lateral sides of the semiconductor die (such as four sides), as well as be formed over the active surface 120 of the semiconductor die 114. The same single encapsulant 256 can also be formed around and directly contact the sides of the conductive bumps 128 and the sides 252a of conductive interconnects 252 in a single step to form at least part of a molded bridge interposer panel or molded panel 258. The molded bridge interposer panel or molded panel 258 may comprise one build-up interconnect structure 170, as shown in FIG. 4F, or may comprise two opposing build-up interconnect structures 170, 270, as illustrated in FIG. 4G. While a method is shown of forming build-up interconnect structure 170 first, followed by building build-up interconnect structure 270, the order may be reversed. In some instances, the encapsulation and frontside build-up interconnect structure 270 may be built first, followed by removal of the temporary carrier 140, and further followed by the formation of the backside build-up interconnect structure 170.

The molded panel 258 can optionally undergo a curing process or post mold cure (PMC) to cure the encapsulant 256. In some instances, a top surface, front surface, or first surface 262 of the encapsulant 256 can be substantially coplanar with first end 253 of the conductive interconnects 252. Alternatively, the top surface 262 of the encapsulant 256 can be over, offset, or vertically separated from the first ends 253 of the conductive interconnects 252, such that the first ends 253 of the conductive interconnects 252 are exposed with respect to the encapsulant 256 after the reconstituted wafer 258 undergoes a grinding operation, or through a recess 257 in the encapsulant 256 to expose the first end 253.

The molded panel 258 can also undergo an optional grinding operation with grinder 264 to planarize the top surface, front surface, or first surface 268 of the molded panel 258 and to reduce a thickness of the molded panel 258, and to planarize the top surface 262 of the encapsulant 256 and to planarize the top surface 268 of the molded panel 258. The top surface 268 of the molded panel 258 can comprise the top surface 262 of the encapsulant 256, the first ends of the conductive interconnects 252, or both. A chemical etch can also be used to remove and planarize the encapsulant 256 and the molded panel 258. Thus, the top surface 268 of the conductive interconnects 252 can be exposed with respect to encapsulant 256 in the peripheral area 143 to provide for electrical connection between semiconductor die 114 and a subsequently formed redistribution layer or build-up interconnect structure 170.

The reconstituted wafer 258 can also undergo a panel trim or trimming to remove excess encapsulant 256 that has remained in undesirable locations as a result of a molding process, such as eliminating a flange present for a mold chase. The molded panel 258 can include a footprint or form factor of any shape and size including a circular, rectangular, or square shape, the reconstituted wafer 258 comprising a diameter, length, or width of, or about, 200 millimeter (mm), 300 mm, or any other desirable size.

FIG. 4F also shows that actual positions of the semiconductor die 114 within the molded panel 258 may be measured with an inspection device or optical inspection device 259. As such, subsequent processing of the fully molded panel 258 as shown and described with respect to subsequent FIGs. can be performed with respect to the actual positions of the semiconductor die 114 within the molded panel 258.

FIG. 4G. shows forming a build-up interconnect structure 270—such as a second or active side build-up interconnect structure—over the molded panel 258 to electrically connect, and provide routing between, conductive interconnects 252 and the conductive bumps 128. While the build-up interconnect structure 270 is shown comprising three conductive layers and three insulating layer, a person of ordinary skill in the art will appreciate that fewer layers or more layers can be used depending on the configuration and design of the fully-molded bridge interposer 300. The build-up interconnect structure 270 can optionally comprise a first insulating or passivation layer 272 formed or disposed over the molded panel 258. The first insulating layer 272 can comprise one or more layers of $SiO_2$, $Si_3N_4$, SiON, $Ta_2O_5$, $Al_2O_3$, polymer, polyimide, BCB, PBO, or other material having similar insulating and structural properties. The insulating layer 272 can be formed using PVD, CVD, printing, spin coating, spray coating, sintering or thermal oxidation. Openings or first level conductive vias can be formed through the insulating layer 272 over the conductive interconnects 252 and the conductive bumps 128 to connect with the semiconductor die 114.

A first conductive layer 274 can be formed over the molded panel 258 and over the first insulating layer 272 as a first RDL layer to extend through the openings in the first insulating layer 272, to electrically connect with the first level conductive vias, and to electrically connect with the conductive bumps 128 and the conductive interconnects 252. As used herein, the term RDL includes distribution, redistribution, or movement, of signal through the conductive material in a vertical direction, horizontal direction, or both. As such, an RDL may, but need not have, a horizontal component. Conductive layer 274 can be one or more layers of Al, Cu, Sn, Ni, Au, Ag, or other suitable electrically conductive material formed using a patterning and metal deposition process such as sputtering, electrolytic plating, and electroless plating, or other suitable process.

When the first conductive layer 274 is formed, it may be formed at least partially within a corresponding first via layer formed within the first insulating layer 272 of the frontside build-up interconnect structure 270. The first conductive layer 274 may comprises vias aligned to centers 128c of the copper studs 128. The alignment with the centers 128c of studs or conductive bumps 128 may be measured with an $r^2$ (or R-squared) value for a lot (or statistically significant number) of die 114 or devices 300. The R-squared value (also known as the coefficient of correlation) is a statistical measure of how closely data is fitted to a regression line, which in this case is based on the lot of die 114 or devices 300. Stated another way, an R-squared value is the proportion of the variation in the dependent variable that is predictable from the independent variable. The alignment with the centers 128c of studs or conductive bumps 128 may have an $r^2$ value greater than or equal to 0.5, 0.6, 0.7, 0.8, or in a range greater than or equal to 0.5-0.8 relative to a difference between an offset $O_1$ between a first side 114a of the bridge die 114 and a copper post 252a adjacent the first side 114a of the bridge die 114 and a second offset $O_2$ between a second side 114b of the bridge die 114 opposite the first side 114a of the bridge die 114 and a corresponding copper post 252b adjacent the second side 114b of the bridge die 114. As such, the $r^2$ value of greater than about 0.5 (or 50%), 0.6 (or 60%), 0.7 (or 70%), 0.8 (or 0%), or more between the centers 128c and the centers of the vias 274v of the conductive layer 274 when compared with the difference in the offsets between $O_1$ and $O_2$ provides a structural way of identifying that the processing of the build-up interconnect structure 270 was performed with respect to the actual positions of the semiconductor die 114 within the molded panel 258, thereby allowing for finer pitch connections with the high density and ultra-high density interconnection with the bridge die 114 and the build-up interconnect structure 270. Stated another way, the differences, offsets, or misalignments between the centers 128c and the centers of the vias 274v of the conductive layer 274 is less than (or more closely aligned), than the differences, offsets, or misalignments between the differences in offsets $O_1$ and $O_2$ between the copper posts 252 of the bridge die 114 for the lot of die 114 or devices 300. Stated yet another way, for a lot of die 114 or devices 300, the differences, offsets, or misalignments between the centers 128c and the centers of the vias 274v is not statistically correlated (or has an $r^2$ value less than 0.5) to the alignment of the die to the copper posts 252 on each side of the die 114 (measured by looking at the offsets $O_1$ and $O_2$).

A second insulating or passivation layer 276, which can be similar or identical to the first insulating layer 272, can be disposed or formed over the molded panel 258, the first conductive layer 274, and the first insulating layer 272. An opening or second level conductive via can be formed through the second insulating layer 276 to connect with the first conductive layer 274.

A second conductive layer 278, when desirable and when present, may be similar or identical to the first conductive layer 274, can be formed as a second RDL layer over molded panel 258, over the first insulating layer 272, over the first conductive layer 274, over the second level conductive via, or within an opening of the second insulating layer 272, to electrically connect with the first conductive layer 274, the first level and second level conductive vias, and the semiconductor die 114.

A third insulating or passivation layer 280, when desirable and when present, may be similar or identical to the first insulating layer 272, can be disposed or formed over the second conductive layer 278 and the second insulating layer 276. An opening or a third level conductive via can also be formed in or through the third insulating layer 280 to connect with the second conductive layer 278.

A third conductive layer 282, when desirable and when present, may be similar or identical to the second conductive layer 278, can be formed as a third RDL layer—or as vias or vertical interconnects through the third insulating layer 280—and be further disposed over the second insulating layer 276, over the second conductive layer 278, over the second level conductive via, or within an opening of the second insulating layer 276. The third conductive layer 282 can electrically connect with the second conductive layer 278, and be coupled with the conductive interconnects 252 and the semiconductor die 114.

In some instances, the third (or final) conductive layer within the build-up interconnect structure 270 cam be formed as UBMs 282 that are formed over the third insulating layer 80 to electrically connect with the other conductive layers and conductive vias within the build-up interconnect structure 270, as well as electrically connect to the semiconductor die 114, the conductive bumps 128, and the conductive interconnects 252. UBMs 282, like all of the layers, plating layers, or conductive layers formed by a plating process as presented herein, can be a multiple metal stack comprising one or more of an adhesion layer, barrier layer, seed layer, or wetting layer. The adhesion layer can comprise titanium (Ti), or titanium nitride (TiN), titanium tungsten (TiW), Al, or chromium (Cr). The barrier layer can be formed over the adhesion layer and can be made of Ni, NiV, platinum (Pt), palladium (Pd), TiW, or chromium copper (CrCu). In some instances, the barrier layer can be a sputtered layer of TiW or Ti and can serve as both the adhesion layer and the barrier layer. In either event, the barrier layer can inhibit unwanted diffusion of material, like Cu. The seed layer can be Cu, Ni, NiV, Au, Al, or other suitable material. For example, the seed layer can be a sputtered layer of Cu comprising a thickness of about 2000 angstroms (e.g., 2000 plus or minus 0-600 angstroms). The seed layer can be formed over the barrier layer and can act as an intermediate conductive layer below subsequently formed upper bumps, balls, or interconnect structures 290. In some instances, the wetting layer can comprise a layer of Cu with a thickness in a range of about 5-11 µm or 7-9 µm. Upper bumps 290, such as when formed of SnAg solder, can consume some of the Cu UBM during reflow and forms an intermetallic compound at the interface between the solder bump 290 and the Cu of the wetting layer. However, the Cu of the wetting layer can be made thick enough to prevent full consumption of the Cu pad by the solder during high temperature aging.

UBMs 282 may be formed as a PoP UBM pad, UBM structure, or land pad, such as for stacked PoP structure, an additional electronic component. In some instances, the UBMs 282 can comprise Ni, Pd and Au. UBMs 282 can provide a low resistive interconnect to build-up interconnect structure 270 as well as a barrier to solder diffusion and seed layer for solder wettability.

The upper bumps 290 can be formed on or coupled to the UBMs 282. The bumps 290 can be formed by depositing an electrically conductive bump material over the UBMs 282 using an evaporation, electrolytic plating, electroless plating, ball drop, or screen-printing process. The bump material can be Al, Sn, Ni, Au, Ag, Pb, bismuth (Bi), Cu, solder, and combinations thereof, with an optional flux solution. For example, the bump material can be eutectic Sn/Pb, high-lead solder, or lead-free solder. The bump material can be bonded to the UBMs 282 using a suitable attachment or bonding process. In one embodiment, the bump material is reflowed by heating the material above its melting point to form spherical balls or bumps 290. In some applications, bumps 290 are reflowed a second time to improve electrical contact to UBMs 282. The bumps 290 can also be compression bonded or thermocompression bonded to the UBMs 282. Bumps 290 represent one type of interconnect structure that can be formed over the conductive interconnects 252, and other desirable structures, such as conductive paste, stud bump, micro bump, or other electrical interconnects may also be used as desired.

FIG. 4H illustrates singulation of the molded panel 258 and build-up interconnect structures 170, 270 with saw blade or laser cutting tool 294 to form individual fully-molded bridge interposers 300. The final interposer structure 300 may be thinner than previous packages, comprising an overall height or thickness of, or on the order of, or about, 50-250, 100-200, or less than or about 150 µm. Stacks of multiple layers can be correspondingly thicker, and increase in multiples of the above ranges, resulting in an overall thickness in a range of 200-1000 µm. As part of the reduced height of the structure, the final structure may be made without an interposer, comprising the build-up interconnect layers and conductive vertical providing the function of an interposer, and serving as s sort of embedded interposer.

FIG. 4H illustrates removing the temporary carrier 140, to expose the second ends 254 of the conductive interconnects 252. The carrier 140 can be removed, e.g., by grinding the carrier 140, by exposing UV release tape 144 to UV radiation separate the UV tape 144 from the glass substrate 140, by thermal release, or other suitable method. After removal of the carrier 140, the molded panel 258 can also undergo an etching process, such as a wet etch, to clean the surface of the molded panel 258 exposed by removal of the temporary carrier 140, including the exposed second ends 254 of the conductive interconnects 252. The exposed second ends 254 of the conductive interconnects 252 can also undergo a coating or pad finishing process, such as by an Organic Solderability Preservative (OSP) coating, solder printing, electroless plating, or other suitable process, to form a PoP UBM pad, UBM structures, land pads, or other suitable structure, as desired.

Lower bumps, balls, or interconnect structures 296, can be formed on or coupled to the exposed second ends 254 of the conductive interconnects 252, as shown, for example, in FIG. 5C. The bumps 296 can be formed by depositing an electrically conductive bump material over the exposed second ends 254 of the conductive interconnects 252 using an evaporation, electrolytic plating, electroless plating, ball drop, or screen-printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be bonded to the exposed second ends 254 of the conductive interconnects 252 using a suitable attachment or bonding process. In one embodiment, the bump material is reflowed by heating the material above its melting point to form spherical balls or bumps 296. In some applications, bumps 296 are reflowed a second time to improve electrical contact to conductive interconnects 252. The bumps 296 can also be compression bonded or thermocompression bonded to the conductive interconnects 252. Bumps 296 represent one type of interconnect structure that can be formed over the conductive interconnects 252, and other desirable structures, such as conductive paste, stud bump, micro bump, or other electrical interconnects may also be used as desired.

FIG. 5A illustrates a high-level perspective view of a fully molded bridge interposer 300 disposed (or sandwiched) between: (i) a chiplet arrangement 310 of semiconductor devices (e.g., a System On Chip (SOC) 312 and High Bandwidth Memory (HBM) devices 314), and (ii) a substrate or package substrate 320, similar to what was shown in FIGS. 2A-2C. In the past, a chiplet 60 or arrangement of semiconductor devices 62, 64 similar to what was shown in FIG. 2A may have been coupled together with silicon interposers comprising TSVS, or EMIBs, as shown and described above with respect to FIGS. 1A-1F. However, FIGS. 5A-5C show the new technology of a fully molded bridge interposer 300 to replace the existing technology of a silicon interposer or EMIB.

FIG. 5B shows a cross-sectional profile view taken along the section-line or box labeled "5B" in FIG. 2B. FIG. 5B shows a cross-sectional profile view of the fully-molded bridge interposer 300, similar to the view shown in FIG. 4H. Moreover, the view of FIG. 5B further includes the features of the fully-molded bridge interposer 300 shown more closely to scale. FIG. 5B shows the peripheral conductive interconnect structures 252 disposed around, and laterally offset from, the semiconductor die 114 and within the encapsulant material 256. The peripheral conductive interconnect structures 252 can extend completely through the encapsulant 256 in a vertical direction from, or adjacent, the top surface 262 of the encapsulant 256 to, or adjacent, the bottom surface 266 of the encapsulant 256 opposite top surface 262 to provide vertical electrical interconnection through the fully-molded bridge interposer 300, which can facilitate stacking of packages in PoP arrangements. FIG. 5B further shows a fully molded bridge interposer 300 disposed between a chiplet arrangement 310 of at least two semiconductor devices (such as a SOC 312 and a HBM 314) and a package substrate 320.

FIG. 5C shows a close-up sectional profile view of a portion of the fully molded bridge interposer 300 of FIG. 5B shown within the section-line or box designated 5C. FIG. 5C shows the semiconductor die 114, conductive or copper bumps or interconnects 128, and conductive or copper posts 252, included within the encapsulant 256. Electrical build-up interconnect structures 170, 270 comprising RDLs are formed above and below opposing surfaces 262, 266 of the encapsulant 256 as well as above and below the semiconductor die 114 and conductive or copper studs 128, and conductive or copper posts 252. The semiconductor die 114, conductive or copper studs 128, and conductive or copper posts 252, are electrically coupled to, or interconnected with, the chiplet arrangement 310, which may include a SOC 312, HBMs 314, and any other number of desired semiconductor devices within the chiplet 310 or SOC 312.

Attachment options for the molded bridge interposer 300, to chiplet arrangement 310 include upper bumps, balls, or interconnect structures 290. Attachment options for the molded bridge interposer 300 to the substrate 320 include lower bumps, balls, or interconnect structures 296. Bumps 290 and 296 may each include: 1) solder bumps, 2) plated copper plus a solder post, and 3) direct copper to copper bonding. Additional design options for the fully molded bridge interposer 300 include: 1) underfill, and 2) over mold, as desired or as applicable.

FIG. 5C also shows exemplary layers labeled with dimensions that are about, or approximately, the dimensions indicated. The semiconductor die 114 may comprise a height or thickness (with or without to die attach material 115) of about 100 μm and the conductive posts 252 may comprise a height of about 125 μm. As used herein "about" and "approximately" mean within a percent difference of less than or equal to 50%, 40%, 30%, 20%, 10%, 5%, 3%, 2%, or 1%.

The fully-molded bridge interposers 300 provide cost advantages for high density integration, which includes integrations comprising 2 μm line and space pitch, and 20 μm area array bond pad pitch. Advantages include: (i) cost reduction greater than or equal to 80% for extending die size with respect to growing monolithic silicon (e.g., $0.01 per $mm^2$ versus $0.06 per $mm^2$), and (ii) cost reduction greater than or equal to 50% compared to laminate embedded bridges (e.g., $0.01 per $mm^2$ vs. $0.03 per $mm^2$. For ultra-high density integration with the fully molded bridge interposer 300, an enabled 20 μm area array bond pad pitch allows for increased or improved input/output (IO) on advanced node silicon without a die size penalty so that the integrated circuit (IC) device IO count is no longer constrained by a number of bond pads which will fit in minimum possible device size. As such, as much as an 80% reduction in die size is possible when total size has been based bond pad area requirements when using existing technology.

While this disclosure includes a number of embodiments in different forms, the drawings and written descriptions present detail of particular embodiments with the understanding that the present disclosure is to be considered as an exemplification of the principles of the disclosed methods and systems, and is not intended to limit the broad aspect of the disclosed concepts to the embodiments illustrated. Additionally, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

What is claimed is:

1. A semiconductor assembly, comprising:
a bridge component comprising copper studs, a backside opposite the copper studs, and no vias formed through the bridge component;
conductive vertical interconnects formed as copper posts disposed in a periphery of the bridge component;
an encapsulant disposed on five sides of the bridge component, on sides of the copper studs, and on sides of the copper posts that leave ends of the copper studs and opposing first and second ends of the copper posts exposed from the encapsulant, wherein the encapsulant is not disposed over the backside of the bridge component;
a die attach film (DAF) disposed over the backside of the bridge component; and
a frontside build-up interconnect structure over the copper studs of the bridge component and coupled to second ends of the copper posts opposite the first ends of the copper posts, the frontside build-up interconnect structure comprising first pads at a first pitch within a footprint of the bridge component of less than or equal to 80 μm and second pads at a second pitch outside a footprint of the bridge component of less than or equal to 80 μm.

2. The semiconductor assembly of claim 1, wherein the bridge component comprises an active device.

3. The semiconductor assembly of claim 1, wherein the bridge component comprises a passive device.

4. The semiconductor assembly of claim 1, further comprising a misalignment of the bridge component with respect to an assembly edge is greater than a misalignment of an under bump metallization (UBM) with respect to the assembly edge.

5. The semiconductor assembly of claim 1, further comprising a backside build-up interconnect structure formed over a backside of the bridge component and coupled to first ends of the copper posts.

6. The semiconductor assembly of claim 1, wherein:
the semiconductor assembly further comprises a total thickness less than or equal to 150 μm; and
the semiconductor assembly is disposed over, and is coupled to, a package substrate, a printed circuit board (PCB), a multilayer ceramic capacitors (MLCC), or a passive device.

7. A semiconductor assembly, comprising:
a bridge component comprising conductive studs;
conductive vertical interconnects disposed in a periphery of the bridge component;
an encapsulant disposed on five sides of the bridge component, on sides of the conductive studs, and on sides of the conductive posts that leave ends of the conductive studs and opposing first and second ends of the conductive posts exposed from the encapsulant;
a die attach film (DAF) disposed over the backside of the bridge component; and
a frontside build-up interconnect structure over the conductive studs of the bridge component and coupled to second ends of the conductive posts opposite the first ends of the conductive posts, the frontside build-up interconnect structure comprising first pads at a first pitch within a footprint of the bridge component and second pads at a second pitch outside a footprint of the bridge component.

8. The semiconductor assembly of claim 7, wherein the bridge component comprises an active device or a passive device.

9. The semiconductor assembly of claim 7, further comprising a misalignment of the bridge component with respect to an assembly edge is greater than a misalignment of an under bump metallization (UBM) with respect to the assembly edge.

10. The semiconductor assembly of claim 7, further comprising:
a first component comprising a system on chip (SOC) integrated circuit, memory controller or high bandwidth memory (HBM) controller, voltage regulator, a serializer/deserializer (SERDES), or active semiconductor die, the first component comprising high density interconnects coupled with a first portion of the high density pads, and low density interconnects coupled with a first portion of the low density pads; and
a second component comprising a SOC integrated circuit, memory controller or HBM controller, voltage regulator, a SERDES, or active semiconductor die, the second component comprising, high density interconnects coupled with a second portion of the high density pads, and low density interconnects coupled with a second portion of the low density pads.

11. The semiconductor assembly of claim 7, wherein the first pitch within a footprint of the bridge component is less than or equal to 80 μm and the second pitch outside a footprint of the bridge component is less than or equal to 80 μm.

12. The semiconductor assembly of claim 7, wherein:
the semiconductor assembly further comprises a total thickness less than or equal to 150 μm; and
the semiconductor assembly is disposed over, and is coupled to, a package substrate, a printed circuit board (PCB), a multilayer ceramic capacitors (MLCC), or a passive device.

13. A method of making a semiconductor assembly, comprising:
providing a carrier;
disposing conductive vertical interconnects in a periphery of a bridge component site;
disposing a bridge component over the carrier and within the bridge component site, wherein the bridge component comprises conductive studs and the bridge component does not comprise vias through the bridge component;
forming an encapsulant disposed on five sides of the bridge component, on sides of the conductive studs, and on sides of the conductive posts that leave ends of the conductive studs and opposing first and second ends of the conductive posts exposed from the encapsulant, wherein the bridge component, conductive posts, and encapsulant together form a molded bridge interposer; and
forming a frontside build-up interconnect structure over the conductive studs of the bridge component and coupled to second ends of the conductive posts opposite the first ends of the conductive posts, the frontside build-up interconnect structure comprising first pads at a first pitch within a footprint of the bridge component and second pads at a second pitch outside a footprint of the bridge component.

14. The method of claim 13, further comprising:
removing at least a portion of the carrier; and
removing a portion of the encapsulant from over the conductive posts and the conductive studs.

15. The method of claim 13, wherein:
a pitch of the conductive studs comprises a pitch of less than or equal to 80 μm; and
the first pitch is less than or equal to the second pitch.

16. The method of claim 15, further comprising forming a backside build-up interconnect structure formed over the temporary carrier before disposing the bridge component over the temporary carrier and over the backside build-up interconnect structure.

17. The method of claim 13, wherein the bridge component comprises an active device or a passive component.

18. The method of claim 13, further comprising:
coupling a first component comprising a system on chip (SOC) integrated circuit, memory controller or high bandwidth memory (HBM) controller, voltage regulator, a serializer/deserializer (SERDES), or active semiconductor die to the molded bridge interposer, the first component comprising interconnects coupled with a first portion of the first pads, and lower density interconnects coupled with a first portion of the second pads; and
coupling a second component comprising a SOC integrated circuit, memory controller or HBM controller, voltage regulator, a SERDES, or active semiconductor die, the second component comprising interconnects coupled with a second portion of the first pads, and lower density interconnects coupled with a second portion of the second pads.

19. The method of claim 13, further comprising a misalignment of the bridge component with respect to an assembly edge is greater than a misalignment of an under bump metallization (UBM) with respect to the assembly edge.

20. The method of claim 13, further comprising forming the frontside build-up interconnect structure using unit specific patterning.

* * * * *